US010423732B2

(12) United States Patent
Zhang et al.

(10) Patent No.: US 10,423,732 B2
(45) Date of Patent: Sep. 24, 2019

(54) BIDOMAIN SIMULATOR

(71) Applicant: The MathWorks, Inc., Natick, MA (US)

(72) Inventors: Fu Zhang, Sherborn, MA (US); Zhi Han, Acton, MA (US); Murali K. Yeddanapudi, Lexington, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 221 days.

(21) Appl. No.: 15/072,239

(22) Filed: Mar. 16, 2016

(65) Prior Publication Data

US 2016/0196377 A1   Jul. 7, 2016

Related U.S. Application Data

(63) Continuation-in-part of application No. 13/652,180, filed on Oct. 15, 2012, now abandoned, which is a continuation-in-part of application No. 13/291,899, filed on Nov. 8, 2011, now Pat. No. 8,914,262, and a continuation-in-part of application No. 13/291,907, filed on Nov. 8, 2011, now Pat. No. 8,935,137.

(51) Int. Cl.
*G06F 8/10* (2018.01)
*G06F 8/35* (2018.01)
*G06F 17/13* (2006.01)
*G06F 17/50* (2006.01)

(52) U.S. Cl.
CPC ............ *G06F 17/5009* (2013.01); *G06F 8/10* (2013.01); *G06F 8/35* (2013.01); *G06F 17/13* (2013.01)

(58) Field of Classification Search
CPC ................. G06F 17/5009; G06F 2217/16
See application file for complete search history.

(56) References Cited

U.S. PATENT DOCUMENTS

| 6,226,789 | B1 | 5/2001 | Tye et al. |
| 7,904,280 | B2 | 3/2011 | Wood |
| 8,156,147 | B1 | 4/2012 | Tocci et al. |
| 8,914,262 | B2 | 12/2014 | Zhang et al. |

(Continued)

OTHER PUBLICATIONS

Bang Jensen et al., "Digraphs Theory, Algorithms and Applications", Aug. 2007, 772 pages.

(Continued)

*Primary Examiner* — Suzanne Lo
(74) *Attorney, Agent, or Firm* — Cesari and McKenna, LLP; Michael R. Reinemann

(57) ABSTRACT

A method, performed by a computer device, may include selecting one or more input and output points in an executable graphical model in a modeling application and simulating the executable graphical model over a plurality of time points. The method may further include generating a time domain response plot for the executable graphical model based on the simulating; obtaining matrices of partial derivatives based on the selected one or more input and output points at particular time points of the plurality of time points; generating a frequency domain response plot for the executable graphical model based on the obtained matrices of partial derivatives; and generating a bidomain simulator user interface, the bidomain simulator user interface including the generated time domain response plot and the generated frequency domain response plot.

28 Claims, 11 Drawing Sheets

(56) References Cited

U.S. PATENT DOCUMENTS

| | | | |
|---|---|---|---|
| 8,935,137 | B1 | 1/2015 | Han et al. |
| 2003/0216894 | A1 | 11/2003 | Ghaboussi et al. |
| 2004/0194051 | A1 | 9/2004 | Croft |
| 2007/0043992 | A1 | 2/2007 | Stevenson et al. |
| 2007/0083347 | A1 | 4/2007 | Bollobas et al. |
| 2007/0157162 | A1 | 7/2007 | Ciolfi |
| 2007/0174030 | A1 | 7/2007 | Yun et al. |
| 2008/0059739 | A1 | 3/2008 | Ciolfi et al. |
| 2009/0012754 | A1 | 1/2009 | Mosterman et al. |
| 2009/0228250 | A1 | 9/2009 | Phillips |
| 2009/0235252 | A1 | 9/2009 | Weber et al. |
| 2010/0017179 | A1 | 1/2010 | Wasynczuk et al. |
| 2010/0057651 | A1 | 3/2010 | Fung et al. |
| 2010/0228693 | A1 | 9/2010 | Dawson et al. |
| 2010/0262568 | A1 | 10/2010 | Schwaighofer et al. |
| 2011/0137632 | A1 | 3/2011 | Paxson et al. |
| 2012/0023477 | A1 | 1/2012 | Stevenson et al. |
| 2013/0116986 | A1 | 5/2013 | Zhang et al. |
| 2013/0116987 | A1 | 5/2013 | Zhang et al. |
| 2013/0116988 | A1 | 5/2013 | Zhang et al. |
| 2013/0116989 | A1 | 5/2013 | Zhang et al. |
| 2013/0198713 | A1 | 8/2013 | Zhang et al. |
| 2015/0095878 | A1 | 4/2015 | Zhang et al. |
| 2016/0196376 | A1 | 7/2016 | Han et al. |

OTHER PUBLICATIONS

Bauer, "Computational Graphs and Rounding Error", SIAM Journal on Numerical Analysis, vol. 11 No. 1, Mar. 1974, 10 pages.

Griewank, et al., "Evaluating Derivatives: Principles and Techniques of Algorithmic Differentiation", 2008, 458 pages.

Sezer et al., "Nested Epsilon Decompositions of Linear Systems: Weakly Coupled and Overlapping Blocks", Proceedings of the 1990 Bilkent Conference on New Trends in Communication, Control and Signal Processing, vol. 1, (1990), 13 pages.

Zecevic et al., "Control of Complex Systems—Decompositions of Large-Scale Systems", Chapter 1, Communications and Control Engineering, (2010) 27 pages.

Henzinger, "The Theory of Hybrid Automata", Proceedings of the 11th Symposium on Logic in Computer Science (LICS '96) 1996, 30 pages.

Paliwal et al., "State Space Modeling of a Series Compensated Long Distance Transmission System through Graph Theoretic Approach", IEEE, 1978, 10 pages.

Ilic et al., "A Simple Structural Approach to Modeling and Analysis of the Inter-area Dynamics of the Large Electric Power Systems: Part I—Linearized Models of Frequency Dynamics", 1993 North American Power Symposium, Oct. 11-12, 1993, pp. 560-569.

Ilic et al., "A Simple Structural Approach to Modeling and Analysis of the Inter-area Dynamics of the Large Electric Power Systems: Part 11—Nonlinear Models of Frequency and Voltage Dynamics", Oct. 11-12, 1993, pp. 570-578.

Hiskens, Ian A. and Pai, M.A. "Trajectory Sensitivity Analysis of Hybrid Systems." IEEE Transactions on Circuits and Systems—Part I: Fundamental Theory and Applications, vol. 47, No. 2, Feb. 2000, pp. 204-220.

Hiskens, Ian A. and Pai, M.A. "Power System Applications of Trajectory Sensitivities." IEEE, 2002, pp. 1-6.

Nguyen, Tony B., Pai, M.A, and Hiskens, I.A. "Computation of Critical Values of Parameters in Power Systems Using Trajectory Sensitivities—" 14th PSCC, Sevilla, Jun. 24, 2002, Session 39, Paper 5, pp. 1-6.

Serban, Radu and Hindmarsh, Alan C. "CVODES: An ODE Solver with Sensitivity Analysis Capabilities." ACM Transactions on Mathematical Software, vol. V, No. N, Sep. 2003, pp. 1-22.

Griewank, Andreas. "A mathematical view of automatic differentiation." Acta Numerica, 2003, pp. 1-78.

Griewank, Andreas and Reese, Shawn. "On the Calculation of Jacobian Matrices by the Markowitz Rule." Mar. 1992, pp. 1-14.

Zecevic, A.I. and Siljak, D.D. "Design of Robust Static Output Feedback for Large-Scale Systems." IEEE Transactions on Automatic Control, vol. 49, No. 11, Nov. 2004, pp. 1-5.

Peponides, George M. and Kokotovic, Petar V. "Weak Connections, Time Scales, and Aggregation of Nonlinear Systems." IEEE Transactions on Automatic Control, vol. AC-28, No. 6, Jun. 1983, pp. 729-735.

Siljak, D.D. "On Stability of Large-Scale Systems under Structural Perturbations." IEEE Transactions on Systems, Man, and Cybernetics, Jul. 1973, pp. 415-417.

Vidyasagar, M. "Decomposition Techniques for Large-Scale Systems with Nonadditive Interactions: Stability and Stabilizability—" IEEE Transactions on Automatic Control, vol. AC-25, No. 4, Aug. 1980, pp. 773-779.

International Search Report and Written Opinion dated Jan. 31, 2013 issued in corresponding PCT application No. PCT/I/US2012/063223, 9 pages.

Donze, Alexandre; et al., "Systematic Simulation Using Sensitivity Analysis," Hybrid Systems: Computation and Control, Springer Berlin Heidelberg, Apr. 2007, 174-189.

Frank, "Introduction to System Sensitivity Theory," Academic Press, Inc., 1978, 386 pages.

Ilic et al., "Dynamics and Control of Large Electric Power Systems," John Wiley & Sons, Inc., 2000, 838 pages.

Jamshidi et al., "Applications of Fuzzy Logic Towards High Machine Intelligence Quotient Systems", Environmental and Intelligent Manufacturing Systems Series, Prentice Hall PTR, 1997, 423 pages.

Masse, John, et al., "Differentiation, Sensitivity Analysis and Identification of Hybrid Models Symbolic Derivative of Simulink© Models," in IFIP Conference on System Modeling and Optimization, Jul. 21-25, 2003, pp. 173-183.

Siljak, "Decentralized Control of Complex Systems," Dover Publications, Inc. 1991, 528 pages.

Siljak, "Large-Scale Dynamic Systems — Stability and Structure," Dover Publications, Inc. 1978, 416 pages.

Webster, "Wiley Encyclopedia of Electrical and Electronics Engineering — vol. 11," John Wiley & Sons, Inc., 1999, 763 pages.

Zhou et al., "Essentials of Robust Control", Prentice-Hall, Inc., 1998, 411 pages.

BIDOMAIN SIMULATOR

This application is a continuation-in-part of U.S. patent application Ser. No. 13/652,180, entitled "AUTOMATIC SOLVER SELECTION" and filed on Oct. 15, 2012, which is a continuation-in-part of U.S. patent application Ser. No. 13/291,899, entitled "VISUALIZATION OF DATA DEPENDENCY IN GRAPHICAL MODELS" and filed on Nov. 8, 2011, which is hereby incorporated by reference in its entirety. U.S. patent application Ser. No. 13/652,180 is also a continuation-in-part of U.S. patent application Ser. No. 13/291,907, entitled "GRAPH THEORETIC LINEARIZATION AND SENSITIVITY ANALYSIS" and filed on Nov. 8, 2011, which is hereby incorporated by reference in its entirety.

BACKGROUND INFORMATION

A large variety of systems, such as mechanical systems, electrical systems, biological systems, and/or computer systems, may be represented as dynamic systems. Computational tools have been developed to model, simulate, and/or analyze dynamic systems. A computational tool may represent a dynamic system as a graphical model. The graphical model may include blocks that may represent components of the dynamic model. The blocks may be connected to represent relationships between the components. The computational tool may simulate the graphical model and may provide results of the simulation for analysis. The computational tool may use a solver during the simulation. Selecting an appropriate solver for a graphical model may result in a more efficient simulation and may provide more accurate results.

DETAILED DESCRIPTION OF PREFERRED EMBODIMENTS

Figure 1:
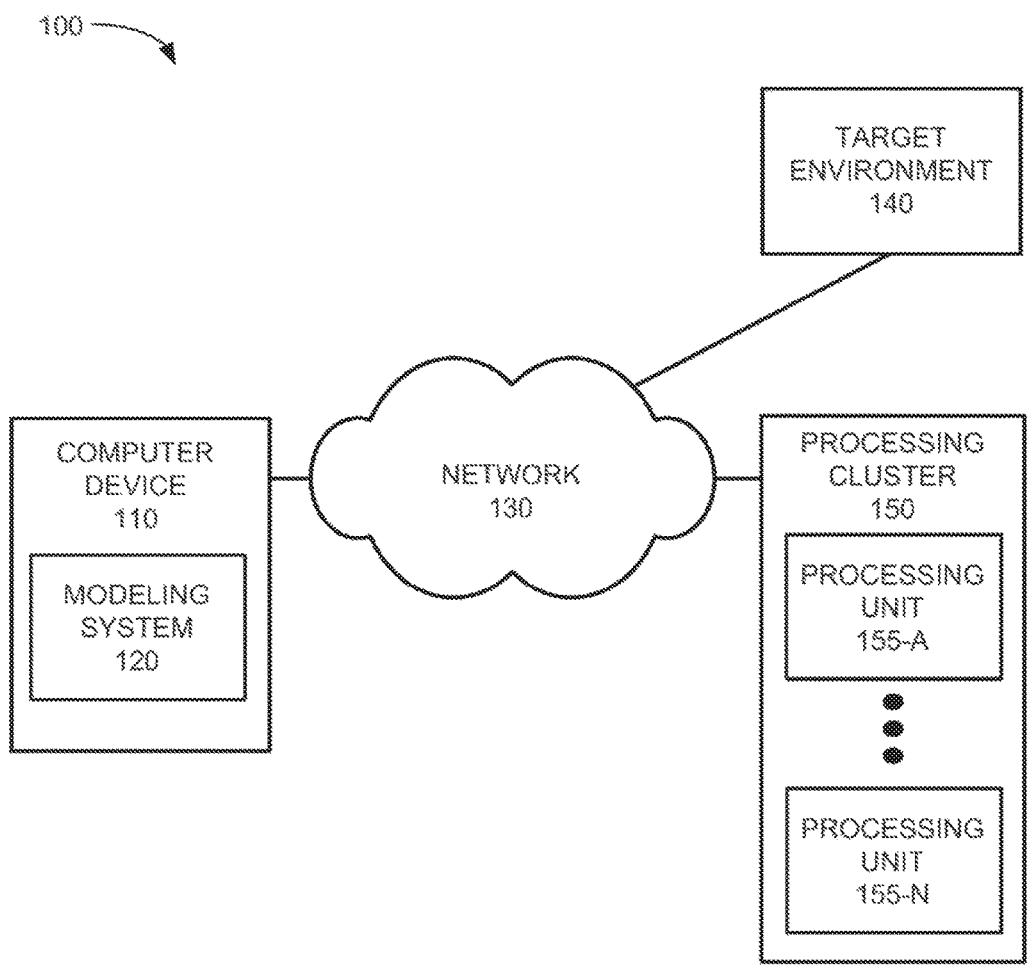
FIG. 1 is a diagram illustrating exemplary components of an environment according to an implementation described herein.

The following detailed description refers to the accompanying drawings. The same reference numbers in different drawings identify the same or similar elements. Also, the following detailed description does not limit the invention.

An implementation described herein relates to automatic solver selection. A dynamic system may be characterized by one or more differential equations. The one or more differential equations may be represented by a graphical model in a modeling system. In order to simulate the dynamic system represented by the graphical model, the one or more differential equations may need to be solved for particular time values.

Assume the following dynamic system:

$$y'(t) = f(y(t), t), y(t_0) = y_0 \qquad \text{Equation (1)}$$

In Equation (1), y'(t) corresponds to the derivative with respect to time of y(t) and $y(t_0)=y_0$ corresponds to the initial condition. An analytical solution may not be available and a solver may determine values for y(t) using numerical methods based on the principle that a nearby point on a curve may be approximated by a tangent line to the curve. Thus, a solver attempts to determine the value of $y(t+\Delta t)$ based on a previously determined value of y(t), wherein $\Delta t$ corresponds to the time step.

Different types of numerical solvers may be available in the modeling system. Solvers may be categorized in different ways. For example, a solver may be categorized as an explicit solver or an implicit solver. An explicit solver may be based on a forward Euler method, which uses the following approximation:

$$y'(t) \approx \frac{y(t+\Delta t) - y(t)}{\Delta t} \qquad \text{Equation (2)}$$

In Equation (2), the derivative of function y(t) may be approximated by a finite difference approximation. Solving Equation (2) for $y(t+\Delta t)$, denoting $y(t_k)$ at time step $t_k$ as $y_k$, and substituting Equation (1) yields:

$$\hat{y}_{k+1} = y_k + \Delta t \cdot f(y_k, t_k) \qquad \text{Equation (3)}$$

In Equation (3), $\hat{y}_{k+1}$ represents the approximation of $y_{k+1}$, which may be based on the determined value of $y_k$. Thus, an explicit solver, which may use Equation (3), may determine the state of the system at a next time step from the state of the system at the current time step.

An implicit solver may be based on a backward Euler method, which may use the following approximation:

$$y'(t+\Delta t) \approx \frac{y(t+\Delta t) - y(t)}{\Delta t} \qquad \text{Equation (4)}$$

Solving Equation (4) for $y(t+\Delta t)$, denoting $y(t_k)$ at time step $t_k$ as $Y_k$, and substituting Equation (1) yields:

$$\hat{y}_{k+1} = y_k + \Delta t \cdot f(y_{k+1}, t_{k+1}) \qquad \text{Equation (5)}$$

In Equation (5), $\hat{y}_{k+1}$ represents the approximation of $y_{k+1}$, which may be based on the current value of $y_k$ as well as the yet undetermined value of $y_{k+1}$. Thus, in an implicit method, $y_{k+1}$ appears on both sides of the equation. Therefore, to determine $y_{k+1}$ using an implicit solver, an algebraic equation may need to be solved. For example, a Newton method may need to be used to determine the roots of the algebraic equation.

An explicit solver may be computationally fast. However, if the dynamic system exhibits a rapidly changing response in a particular time interval, the explicit solver may become unstable and may generate inaccurate results. An implicit solver, on the other hand, may remain stable even if the system exhibits a rapidly changing response. However, the implicit solver may be computationally slow and may result in a slow simulation. Therefore, the properties of a dynamic system may determine whether an explicit solver or an implicit solver is appropriate. Selection of an explicit solver or implicit solver may be based on the stiffness of the dynamic system. A stiff system may exhibit significantly varying time scales, meaning that the system may respond according to a first time scale during a first time interval and may respond according to a second time scale during a second time interval. A stiff system may also be described as a system that includes both components that respond very fast and components that respond very slow.

An implementation described herein relates to calculating a stiffness of a graphical model representing a dynamic system, determining whether the calculated stiffness is greater than a stiffness threshold, automatically selecting an implicit solver, when the calculated stiffness is greater than the stiffness threshold, automatically selecting an explicit solver, when the calculated stiffness is not greater than the stiffness threshold, and performing a simulation of the graphical model using the automatically selected solver.

The stiffness of a graphical model may be determined based on a Jacobian matrix associated with the graphical model. A dynamic system may be represented by a graphical model. The graphical model may include one or more blocks. A block may be characterized by the following equations:

$$x'=f(x,u,t)$$
$$y=g(x,u,t) \quad \text{Equation(6)}$$

In Equation (1), x may represent the states of the block, u may represent inputs to the block, t may represent a time variable, and y may represent outputs of the block. An example of a block that may be associated with a state may be an integrator block. An integrator block may convert a dx/dt signal (i.e., the derivative of x with respect to t) to an x signal. The function $f$, also called the derivative function, may characterize the rate of change of the state variables of the block as a function of the states, inputs, and time. The variables x, u, and y may be vectors. The function g, also called the output function, may characterize the outputs of the block as a function of the states, inputs, and time. While implementations described herein may be described as continuous functions and/or blocks, the implementations described herein may be applied to discrete functions and/or blocks, or to combinations of continuous and discrete functions and/or blocks. For a discrete block, the derivative function may be replaced by an update function and the time variable may be replaced by a time delay variable.

A block Jacobian matrix J for a block may be defined as follows:

$$J = \begin{bmatrix} \frac{\partial f}{\partial x} & \frac{\partial f}{\partial u} \\ \frac{\partial g}{\partial x} & \frac{\partial g}{\partial u} \end{bmatrix} = \begin{bmatrix} A & B \\ C & D \end{bmatrix} \quad \text{Equation (7)}$$

Thus, in the block Jacobian matrix, A may correspond to a matrix that defines the partial derivatives of the derivative function with respect to the states, B may correspond to a matrix that defines the partial derivatives of the derivative function with respect to the inputs, C may correspond to a matrix that defines the partial derivatives of the output function with respect to the states, and D may correspond to a matrix that defines the partial derivatives of the output function with respect to the inputs.

The block Jacobian matrix may be a time varying matrix. In other words, the values of the elements of the block Jacobian matrix may vary with time. For example, assume a block is defined by the following equations:

$$x_1'=x_2^2$$
$$x_2'=x_1+x_2 \quad \text{Equation (8)}$$

The corresponding A matrix of the block Jacobian matrix may be:

$$A = \begin{bmatrix} 0 & 2x_2 \\ 1 & 1 \end{bmatrix} \quad \text{Equation (9)}$$

A graphical model may include multiple blocks. An open loop Jacobian matrix may be determined for a graphical model by the following process. Block Jacobian matrices may be determined for the blocks included in the graphical model. A block Jacobian matrix for a block may be defined by a user, may be determined analytically from one or more equations that are associated with the block, and/or may be determined numerically using a perturbation algorithm. The block Jacobian matrices associated with individual blocks of the graphical model may be concatenated into a single block Jacobian matrix.

For example, assume a graphical model includes a set of blocks $\{b_1, \ldots, b_n\}$ with a subset of blocks $$\{b_{i_1}, \ldots, b_{i_{n_x}}\}$$

that include internal states. The concatenated block Jacobian matrix, also known as the open loop Jacobian matrix, may be defined as:

$$A_0 = \begin{bmatrix} A_1 & & \\ & \ldots & \\ & & A_{n_x} \end{bmatrix} \quad \text{Equation (10)}$$

$$B_0 = \begin{bmatrix} B_1 & & \\ & \ldots & \\ & & B_{n_x} \end{bmatrix}$$

$$C_0 = \begin{bmatrix} C_1 & & \\ & \ldots & \\ & & C_{n_x} \end{bmatrix}$$

$$D_0 = \begin{bmatrix} D_1 & & \\ & \ldots & \\ & & D_{n_x} \end{bmatrix}$$

Submatrix $A_0$ may correspond to the solver Jacobian matrix. The solver Jacobian matrix may be used by a solver during simulation based on the following:

$$y_k' = A \cdot y_k \qquad \text{Equation (11)}$$

Substituting Equation (11) into Equation (3), an explicit solver may use the following equation to determine an approximation of $y_{k+1}$:

$$\hat{y}_{k+1} = y_k + \Delta t \cdot A \cdot y_k \qquad \text{Equation (12)}$$

In the implicit method, Equation (5) may be replaced with the following, more accurate, approximation of $y_{k+1}$:

$$\hat{y}_{k+1} = y_k + \Delta t \cdot \left( \frac{y_k' + y_{k+1}'}{2} \right) \qquad \text{Equation (13)}$$

Substituting Equation (11) into Equation (13) yields:

$$\hat{y}_{k+1} = y_k + \Delta t \cdot \left( \frac{A \cdot y_k + A \cdot y_{k+1}}{2} \right) \qquad \text{Equation (14)}$$

Solving Equation (14) for the approximation of $y_{k+1}$ yields:

$$\hat{y}_{k+1} = \left( I - \frac{\Delta t \cdot A}{2} \right)^{-1} \cdot \left( I + \frac{\Delta t \cdot A}{2} \right) \cdot y_k \qquad \text{Equation (15)}$$

In Equation (15), I represents the identity matrix. As Equation (15) illustrates, an implicit solver may need to compute a matrix inverse, which may be computationally intensive.

The solver Jacobian matrix of a graphical model may also be used to determine the stiffness associated with the graphical model. For example, the stiffness of the graphical model may be calculated based on a ratio of a maximum eigenvalue of the solver Jacobian matrix to a minimum eigenvalue of the solver Jacobian matrix as follows:

$$\text{stiffness} = \frac{\max|\text{Re}(\lambda_1), \ldots, \text{Re}(\lambda_{n_x})|}{\min|\text{Re}(\lambda_1), \ldots, \text{Re}(\lambda_{n_x})|} \qquad \text{Equation (16)}$$

In Equation (16), eigenvalue $\lambda_i$ satisfies the equation $Ax = \lambda_i x$ for some vector x, $\text{Re}(\lambda_i)$ corresponds to the real part of eigenvalue $\lambda_i$, and $|x|$ corresponds to the absolute value of x. While Equation (16) corresponds to a definition of stiffness for some implementations described herein, other implementations may use a different definition of stiffness.

The stiffness may be based on the observation that a general solution to a system represented by $y' = Ay$ may take the following form:

$$y(t) = \sum_{i=1}^{n} k_i \cdot e^{\lambda_i \cdot x_i} + g(t) \qquad \text{Equation (17)}$$

In Equation (17), the summation of the exponential functions may correspond to a transient response of the system and the function g(t) may correspond to a steady-state response of the system. A transient term $e^{\lambda_i \cdot x_i}$ may decay quickly as t increases, if the corresponding eigenvalue $\lambda_i$ is large, and may correspond to a fast transient. A transient term $e^{\lambda_i \cdot x_i}$ may decay slowly as t increases, if the corresponding eigenvalue $\lambda_i$ is small, and may correspond to a slow transient. Thus, a stiff system may be characterized as a system in which the ratio of the fastest transient response to the slowest transient response is large. A stiff system may be unstable with respect to an explicit solver and an implicit solver may need to be selected to avoid inaccurate results. Furthermore, as the stiffness may depend on the eigenvalues of the Jacobian matrix, and as the Jacobian matrix may be time-dependent, stiffness may be a local property of a system that may change with time.

In other implementations, a different definition of stiffness may be used. As an example, in another implementation, the stiffness may be calculated based on the maximum eigenvalue of the solver Jacobian matrix. As another example, the stiffness may be calculated as a ratio of a solver step size to the smallest damping time constant. The smallest damping time constant may be defined as $\min(-1/\text{Re}(\lambda_i))$.

A solver may also be categorized as a fixed step solver or a variable step solver. A fixed step solver may compute the time of the next simulation step by adding a fixed step size to the current time step. A fixed step solver may be computationally fast, but may not be accurate if the response of the system varies faster than the fixed step size. A variable step solver may vary the step size based on a specified error tolerance. The variable step solver may select a particular step size for a next time step and may compute an approximation for the next step size. The variable step solver may then compute the approximation using another method, such as a more accurate method, and may compare the two approximations. If the error between the two approximations is less than a specified error tolerance, the variable step solver may maintain the selected step size (or may attempt to increase the selected step size). If the error between the two approximations exceeds the specified error tolerance, the variable step solver may reduce the selected step size and may recompute the two approximations. The variable step solver may continue to reduce the step size until the error between the two approximations is less than the specified error tolerance.

The variable step solver may need to select a maximum step size. A higher maximum step size may result in a faster simulation. However, if the maximum step size is too high, the variable step solver may either generate an inaccurate result or may result in a high error rate, which may cause frequent step size reductions and a slower simulation. Thus, an appropriate maximum step size for a variable step solver may improve simulation efficiency.

The maximum step size may be selected so as not to exceed the fastest expected response associated with a dynamic system. The response of a graphical model may be based on the natural frequencies associated with the dynamic system and on forcing frequencies associated with the dynamic system. The natural frequencies may represent the inherent properties of the graphical model and the forcing frequencies may be based on forces (e.g., source signals) being applied to the dynamic system.

An implementation described herein relates to selecting a maximum step size based on the eigenvalues associated with the solver Jacobian matrix. For example, an eigenvalue associated with the highest natural frequency may be identified, a highest forcing frequency used as an input to the graphical model may be identified, and the maximum step size may be selected based on a maximum of the highest natural frequency and the highest forcing frequency.

Furthermore, an implementation described herein relates to selecting different solvers for different state variables associated with a graphical model. For example, a stiffness associated with the state variable may be determined, if the stiffness associated with the state variable is less than a stiffness threshold, and if a tolerance associated with the state variable is less than a tolerance threshold, an explicit solver for the state variable may be selected. If the stiffness associated with the state variable is greater than the stiffness threshold, and if the tolerance associated with the state variable is not less than the tolerance threshold, an implicit solver may be selected for the state variable. Thus, different solvers may be selected for different state variables associated with the graphical model.

FIG. 1 is a diagram of an exemplary environment 100 according to an implementation described herein. As shown in FIG. 1, environment 100 may include a computer device 110, a network 130, a target environment 140, and a processing cluster 150.

Computer device 110 may include one or more computer devices, such as a personal computer, a workstation, a server device, a blade server, a mainframe, a personal digital assistant (PDA), a laptop, a tablet, or another type of computation or communication device. Computer device 110 may include a modeling system 120. Modeling system 120 may include a development tool that enables creation, modification, design, and/or simulation of graphical models representing dynamic systems. Furthermore, modeling system 120 may enable the automatic generation of executable code based on a graphical model. Modeling system 120 may perform an automatic solver selection for a simulation of the graphical model.

Network 130 may enable computer device 110 to communicate with other components of environment 100, such as target environment 140 and/or processing cluster 150. Network 130 may include one or more wired and/or wireless networks. For example, network 130 may include a cellular network, the Public Land Mobile Network (PLMN), a second generation (2G) network, a third generation (3G) network, a fourth generation (4G) network (e.g., a long term evolution (LTE) network), a fifth generation (5G) network, a code division multiple access (CDMA) network, a global system for mobile communications (GSM) network, a general packet radio services (GPRS) network, a Wi-Fi network, an Ethernet network, a combination of the above networks, and/or another type of wireless network. Additionally, or alternatively, network 130 may include a local area network (LAN), a wide area network (WAN), a metropolitan area network (MAN), an ad hoc network, an intranet, the Internet, a fiber optic-based network (e.g., a fiber optic service network), a satellite network, a television network, and/or a combination of these or other types of networks.

Target environment 140 may include one or more devices that may be associated with a dynamic system that is represented by a graphical model in modeling system 120. For example, target environment 140 may include a set of sensors and/or a set of controllers corresponding to a dynamic system. Modeling system 120 may receive data from target environment 140 and use the received data as input to the graphical model. Furthermore, target environment 140 may receive executable code from modeling system 120. The received executable code may enable target environment 140 to perform one or more operations on the dynamic system associated with target environment 140.

Processing cluster 150 may include processing resources which may be used by modeling system 120 in connection with a graphical model. For example, processing cluster 150 may include processing units 155-A to 155-N (referred to herein collectively as "processing units 155" and individually as "processing unit 155"). Processing units 155 may perform operations on behalf of computer device 110. For example, processing units 155 may perform parallel processing on a graphical model in modeling system 120. Modeling system 120 may provide an operation to be performed to processing cluster 150, processing cluster 150 may divide tasks associated with the operation among processing units 155, processing cluster 150 may receive results of the performed tasks from processing units 155, and may generate a result of the operation and provide the result of the operation to modeling system 120.

In one implementation, processing unit 155 may include a graphic processing unit (GPU). A GPU may include one or more devices that include specialized circuits for performing operations relating to graphics processing (e.g., block image transfer operations, simultaneous per-pixel operations, etc.) and/or for performing a large number of operations in parallel. In another example, processing unit 155 may correspond to a single core of a multi-core processor. In yet another example, processing unit 155 may include a computer device that is part of a cluster of computer devices.

Although FIG. 1 shows exemplary components of environment 100, in other implementations, environment 100 may include fewer components, different components, differently arranged components, and/or additional components than those depicted in FIG. 1. Alternatively, or additionally, one or more components of environment 100 may perform one or more tasks described as being performed by one or more other components of environment 100.

Figure 2:
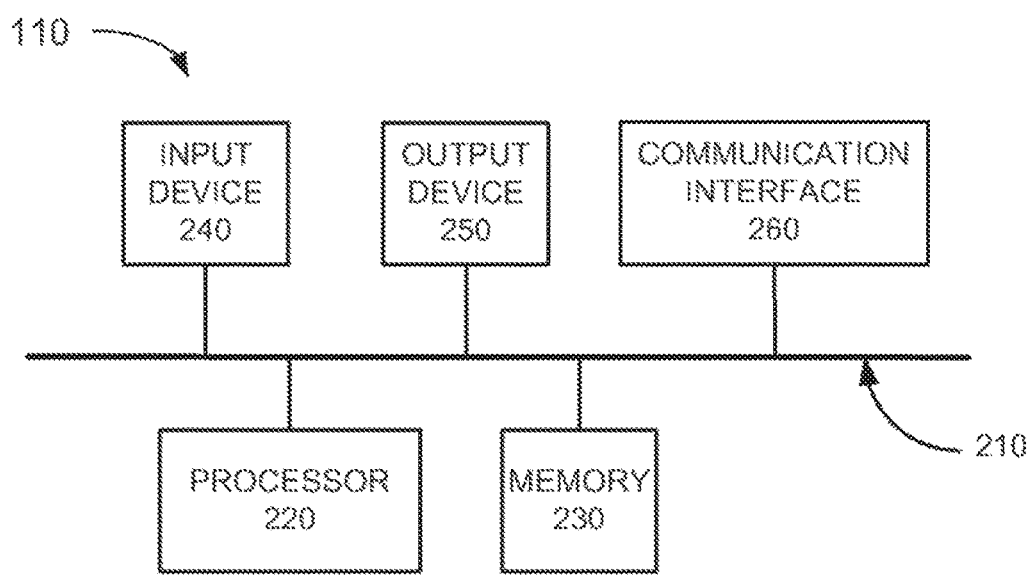
FIG. 2 is a diagram illustrating exemplary components of the computer device of FIG. 1.

FIG. 2 is a diagram illustrating exemplary components of computer device 110 according to a first implementation described herein. As shown in FIG. 2, computer device 110 may include a bus 210, a processor 220, a memory 230, an input device 240, an output device 250, and a communication interface 260.

Bus 210 may include a path that permits communication among the components of computer device 200. Processor 220 may include one or more single-core and/or or multi-core processors, microprocessors, and/or processing logic (e.g., application specific integrated circuits (ASICs), field programmable gate arrays (FPGAs), Advanced RISC Machines (ARM) processors, etc.) that may interpret and execute instructions. Memory 230 may include a random access memory (RAM) device or another type of dynamic storage device that may store information and instructions for execution by processor 220, a read only memory (ROM) device or another type of static storage device that may store static information and instructions for use by processor 220, a magnetic and/or optical recording memory device and its corresponding drive, and/or a removable form of memory, such as a flash memory.

Input device 240 may include a mechanism that permits an operator to input information to computer device 110, such as a keypad, a keyboard, a touch screen, a button, or an input jack for an input device such as a keypad or a keyboard, a camera, a microphone, an analog to digital (ADC) converter, a pulse-width modulation (PWD) input, etc. Output device 250 may include a mechanism that outputs information to the operator, including one or more light indicators, a display, a touch screen, a speaker, a digital to analog (DAC) converter, a PWM output, etc.

Communication interface 260 may include a transceiver that enables computer device 110 to communicate with other devices and/or systems. For example, communication interface 260 may include a modem, a network interface card, and/or a wireless interface card.

As will be described in detail below, computer device 110 may perform certain operations relating to automatic solver selection. Computer device 110 may perform these operations in response to processor 220 executing software instructions stored in a computer-readable medium, such as memory 230. A computer-readable medium may be defined as a non-transitory memory device. A memory device may include memory space within a single physical memory device or spread across multiple physical memory devices.

The software instructions may be read into memory 230 from another computer-readable medium, or from another device via communication interface 260. The software instructions contained in memory 230 may cause processor 220 to perform processes that will be described later. Alternatively, hardwired circuitry may be used in place of or in combination with software instructions to implement processes described herein. Thus, implementations described herein are not limited to any specific combination of hardware circuitry and software.

Although FIG. 2 shows exemplary components of computer device 110, in other implementations, computer device 110 may include fewer components, different components, additional components, or differently arranged components than depicted in FIG. 2. Additionally or alternatively, one or more components of computer device 110 may perform one or more tasks described as being performed by one or more other components of computer device 200.

Figure 3:
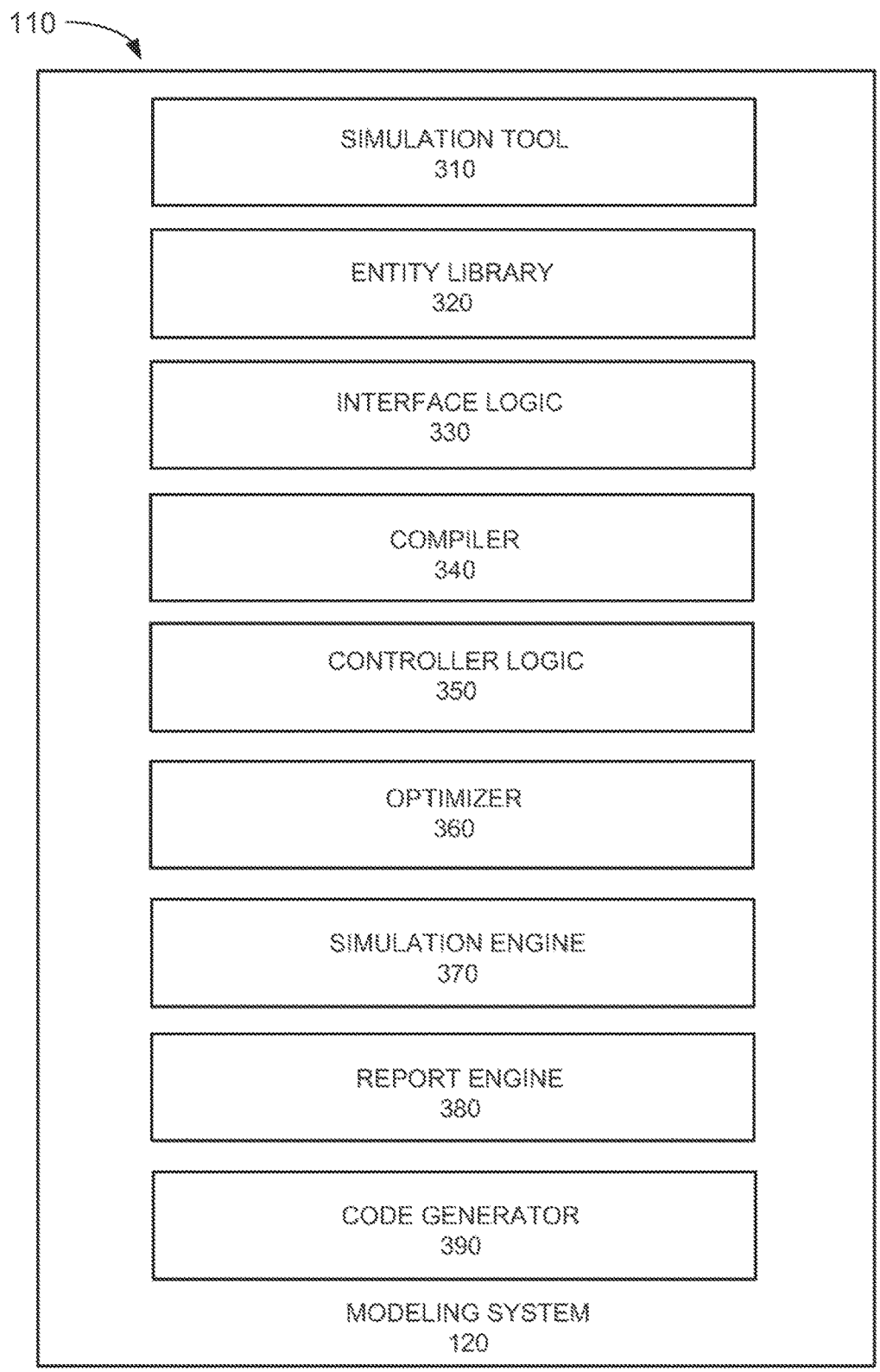
FIG. 3 is a diagram of exemplary components of a modeling system that may be included in the computer device of FIG. 1.

FIG. 3 is a diagram of exemplary components of modeling system 120 that may be included in computer device 110. Modeling system 120 may include a development tool that enables existing software components to be used in the creation of a model and that may enable generation of executable code based on the model. For example, the development tool may include a graphical modeling tool or application that provides a user interface for a numerical computing environment. Additionally, or alternatively, the development tool may include a graphical modeling tool and/or application that provides a user interface for modeling and executing a dynamic system (e.g., based on differential equations, difference equations, algebraic equations, discrete events, discrete states, stochastic relations, etc.).

A dynamic system (either natural or man-made) may be a system whose response at any given time may be a function of its input stimuli, its current state, and a current time. Such systems may range from simple to highly complex systems. Natural dynamic systems may include, for example, a falling body, the rotation of the earth, bio-mechanical systems (muscles, joints, etc.), bio-chemical systems (gene expression, protein pathways), weather, and climate pattern systems, and/or any other natural dynamic system. Man-made or engineered dynamic systems may include, for example, a bouncing ball, a spring with a mass tied on an end, automobiles, airplanes, control systems in major appliances, communication networks, audio signal processing systems, and a financial or stock market, and/or any other man-made or engineered dynamic system.

The system represented by a model may have various execution semantics that may be represented in the model as a collection of modeling entities, often referred to as blocks. A block may generally refer to a portion of functionality that may be used in the model. The block may be represented graphically, textually, and/or stored in some form of internal representation. Also, a particular visual depiction used to represent the block, for example in a graphical block diagram, may be a design choice.

A block may be hierarchical in that the block itself may comprise one or more blocks that make up the block. A block comprising one or more blocks (sub-blocks) may be referred to as a subsystem block. A subsystem block may be configured to represent a subsystem of the overall system represented by the model. A subsystem may be a masked subsystem that is configured to have a logical workspace that contains variables only readable and writeable by elements contained by the subsystem.

A graphical model (e.g., a functional model) may include entities with relationships between the entities, and the relationships and/or the entities may have attributes associated with them. The entities my include model elements such as blocks and/or ports. The relationships may include model elements such as lines (e.g., connector lines) and references. The attributes may include model elements such as value information and meta information for the model element associated with the attributes. A graphical model may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks. A relationship between two ports may be created by connecting a line (e.g., a connector line) between the two ports. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks may be causal and/or non-causal. For example, a model (e.g., a functional model) may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port and the connection with the input port of the data logging block may make this value available to the data logging block.

In one example, a block may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., X=2Y) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

Assigning causality to equations may consist of determining which variable in an equation is computed by using that equation. Assigning causality may be performed by sorting algorithms, such as a Gaussian elimination algorithm. The result of assigning causality may be a lower block triangular matrix that represents the sorted equations with strongly connected components representative of algebraic loops. Assigning causality may be part of model compilation.

Equations may be provided in symbolic form. A set of symbolic equations may be symbolically processed to, for example, produce a simpler form. To illustrate, a system of two equations X=2Y+U and Y=3X−2U may be symbolically processed into one equation 5Y=−U. Symbolic processing of equations may be part of model compilation.

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally describes a directionally consistent signal flow between blocks, in other implementations, the interactions between blocks may not necessarily be directionally specific or consistent.

In an embodiment, connector lines in a model may represent related variables that are shared between two connected blocks. The variables may be related such that their combination may represent power. For example, connector connector lines may represent voltage, and current, power, etc. Additionally, or alternatively, the signal flow between blocks may be automatically derived.

In some implementations, one or more of blocks may also, or alternatively, operate in accordance with one or more rules or policies corresponding to a model in which they are included. For instance, if the model were intended to behave as an actual, physical system or device, such as an electronic circuit, the blocks may be required to operate within, for example, the laws of physics (also referred to herein as "physics-based rules"). These laws of physics may be formulated as differential and/or algebraic equations (e.g., constraints, etc.). The differential equations may include derivatives with respect to time, distance, and/or other quantities, and may be ordinary differential equations (ODEs), partial differential equations (PDEs), and/or differential and algebraic equations (DAEs). Requiring models and/or model components to operate in accordance with such rules or policies may, for example, help ensure that simulations based on such models will operate as intended.

A sample time may be associated with the elements of a graphical model. For example, a graphical model may include a block with a continuous sample time such as a continuous-time integration block that may integrate an input value as time of execution progresses. This integration may be specified by a differential equation. During execution the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Alternatively, or additionally, a graphical model may include a block with a discrete sample time such as a unit delay block that may output values of a corresponding input after a specific delay. This delay may be a time interval and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may include a block with an asynchronous sample time, such as a function-call generator block that may schedule a connected block to be evaluated at a non-periodic time. During execution, a function-call generator block may evaluate an input and when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. The inferring may be part of a model compilation. For example, the graphical model may include a block, such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks where the output of the first of the two unit delay blocks is connected to the input of the second of the two unit delay block. The sample time of the first unit delay block may be inferred from the sample time of the second unit delay block. This inference may be performed by propagation of model element attributes such that after evaluating the sample time attribute of the second unit delay block, a graph search proceeds by evaluating the sample time attribute of the first unit delay block since it is directly connected to the second unit delay block.

The values of attributes of a graphical model may be set to characteristics settings, such as one or more inherited settings, one or more default settings, etc. For example, the data type of a variable that is associated with a block may be set to a default such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In case of an inherited sample time, a specific sample time may be inferred based on attributes of elements that the graphical model comprises and/or attributes of the graphical model (e.g., a fundamental execution period).

Modeling system 120 may implement a technical computing environment (TCE). A TCE may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Java, etc.

In one implementation, the TCE may include a dynamically typed language that can be used to express problems and/or solutions in mathematical notations familiar to those of skill in the relevant arts. For example, the TCE may use an array as a basic element, where the array may not require dimensioning. In addition, the TCE may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

The TCE may further provide mathematical functions and/or graphical tools (e.g., for creating plots, surfaces, images, volumetric representations, etc.). In one implementation, the TCE may provide these functions and/or tools using toolboxes (e.g., toolboxes for signal processing, image processing, data plotting, parallel processing, etc.). In another implementation, the TCE may provide these functions as block sets. In still another implementation, the TCE may provide these functions in another way, such as via a library, etc. The TCE may be implemented as a text based environment, a graphically based environment, or another type of environment, such as a hybrid environment that is both text and graphically based.

The TCE may be implemented using products such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dassault Systèmes.

An alternative embodiment may implement a TCE in a graphically-based TCE using products such as, but not limited to, Simulink®, Stateflow®, SimEvents®, etc., by The MathWorks, Inc.; VisSim by Visual Solutions; LabView® by National Instruments; Dymola by Dassault Systèmes; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment.

A further alternative embodiment may be implemented in a language that is compatible with a product that includes a TCE, such as one or more of the above identified text-based or graphically-based TCEs. For example, MATLAB (a text-based TCE) may use a first command to represent an array of data and a second command to transpose the array. Another product, that may or may not include a TCE, may be MATLAB-compatible and may be able to use the array command, the array transpose command, or other MATLAB commands. For example, the other product may use the MATLAB commands to perform model checking.

Yet another alternative embodiment may be implemented in a hybrid TCE that combines features of a text-based and graphically-based TCE. In one implementation, one TCE may operate on top of the other TCE. For example, a text-based TCE (e.g., MATLAB) may operate as a foundation and a graphically-based TCE (e.g., Simulink) may operate on top of MATLAB and may take advantage of text-based features (e.g., commands) to provide a user with a graphical user interface and graphical outputs (e.g., graphical displays for data, dashboards, etc.).

As shown in FIG. 3, modeling system 120 may include a simulation tool 310, an entity library 320, an interface logic 330, a compiler 340, a controller logic 350, an optimizer 360, a simulation engine 370, a report engine 380, and a code generator 390.

Simulation tool 310 may include an application for building a model. Simulation tool 310 may be used to build a textual model or a graphical model having executable semantics. In the case of graphical models, simulation tool 310 may allow users to create, display, modify, diagnose, annotate, delete, print, etc., model entities and/or connections. Simulation tool 310 may interact with other entities illustrated in FIG. 1 for receiving user inputs, executing a model, displaying results, generating code, etc. Simulation tool 310 may provide a user with an editor for constructing or interacting with textual models and/or a GUI for creating or interacting with graphical models. The editor may be configured to allow a user to, for example, specify, edit, annotate, save, print, and/or publish a model. A textual interface may be provided to permit interaction with the editor. A user may write scripts that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Entity library 320 may include code modules or entities (e.g., blocks/icons) that a user can drag and drop into a display window that includes a graphical model. In the case of graphical models, a user may further couple entities using connections to produce a graphical model of a system, such as target environment 140.

Interface logic 330 may allow modeling system 120 to send or receive data and/or information to/from devices (e.g., target environment 140, processing cluster 150, etc.) or software modules (e.g., a function, an application program interface, etc.).

Compiler 340 may compile a model into an executable format. Compiled code produced by compiler 340 may be executed on computer device 110 to produce a modeling result. In an embodiment, compiler 340 may also provide debugging capabilities for diagnosing errors associated with the model. Complier 340 may generate executable code for a part of a graphical model. The executable code may then be automatically executed during execution of the model, so that a first part of the model executes as an interpreted execution and a second part of the model executes as a compiled execution.

Controller logic 350 may be used to create and implement controllers in a graphical model. For example, controller logic 350 may provide functionality for entities that represent types of controllers in the graphical model. When the graphical model executes, controller logic 350 may perform control operations on the model by interacting with entities in the graphical model. In an embodiment, controller logic 350 may include control algorithms that implement controllers in the graphical model, such as, for example, 'proportional-integral-derivative' (PID) controls, gain scheduling controls, H-infinity controls, model predictive controls (MPC), dynamic inversion controls, bang/bang controls, sliding mode controls, deadbeat controls, and/or other another type of controls. Embodiments of controller logic 350 may be configured to operate in standalone or distributed implementations.

Optimizer 360 may optimize code, parameters, performance (e.g., execution speed, memory usage), etc., for a model. For example, optimizer 360 may optimize code to cause the code to occupy less memory, to cause the code to execute more efficiently, to cause the code to execute faster, etc., than the code would execute if the code were not optimized. Optimizer 360 may also perform optimizations for controller logic 350, e.g., to optimize parameters for a controller. In an embodiment, optimizer 360 may operate with or may be integrated into compiler 340, controller logic 350, code generator 390, etc. Embodiments of optimizer 360 may be implemented via software objects that interact with other object oriented software, e.g., for receiving data on which optimizer 360 operates.

Simulation engine 370 may perform operations for executing a model to simulate a system. Executing a model to simulate a system may be referred to as simulating a model. Simulation engine 370 may be configured to perform standalone or remote simulations based on user preferences or system preferences.

Report engine 380 may produce a report based on information in modeling system 120. For example, report engine 380 may produce a report indicating whether a controller satisfies design specifications, a report indicating whether a controller operates in a stable manner, a report indicating whether a model compiles properly, etc. Embodiments of report engine 380 can produce reports in an electronic format for display on output device 250, in a hardcopy format, and/or a format adapted for storage in a storage device.

Code generator 390 can generate code from a model. In an embodiment, code generator 390 may be configured to compile and link the generated code to produce an "in-memory executable" version of a model. The in-memory executable version of model may be used, for example, to simulate, verify, trim, and/or linearize the model. In an embodiment, code generator 390 may receive code in a first format and may transform the code from the first format into a second format. In an embodiment, code generator 390 can generate source code, assembly language code, binary code, interface information, configuration information, performance information, task information, etc., from at least a portion of a model. For example, code generator 390 can generate C, C++, SystemC, Java, Structured Text, etc., code from the model.

Embodiments of code generator 390 can further generate Unified Modeling Language (UML) based representations and/or extensions from some or all of a graphical model (e.g., System Modeling Language (SysML), Extensible Markup Language (XML), Modeling and Analysis of Real Time and Embedded Systems (MARTE), Architecture Analysis and Design Language (AADL), Hardware Description Language (HDL), Automotive Open System Architecture (AUTOSAR), etc.). In an embodiment, optimizer 360 can interact with code generator 390 to generate code that is optimized according to a parameter (e.g., memory use, execution speed, multi-processing, etc.). Embodiments of modeling environments consistent with principles of the invention can further include components such as verification components, validation components, etc.

Although FIG. 3 shows exemplary components of modeling system 120, in other implementations, modeling system 120 may include fewer components, different components, differently arranged components, or additional components than depicted in FIG. 3. Additionally or alternatively, one or more components of modeling system 120 may perform one or more tasks described as being performed by one or more other components of modeling system 120.

Figure 4:
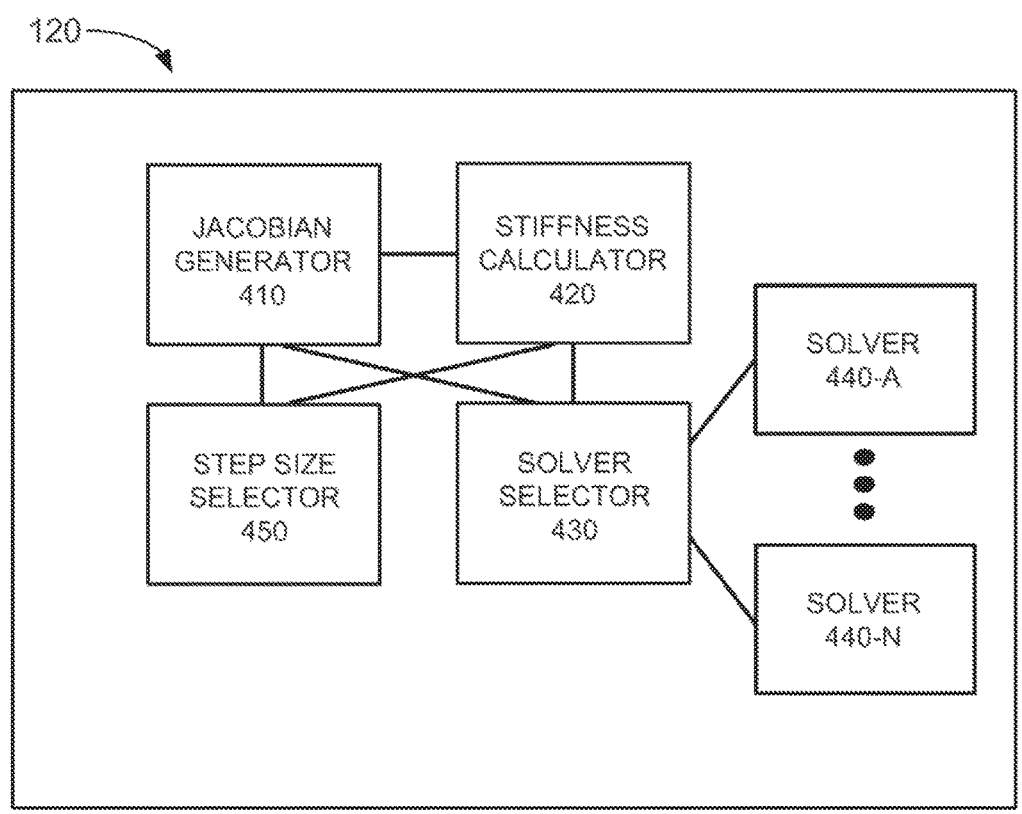
FIG. 4 is a diagram of exemplary functional components of the modeling system of FIG. 3.

FIG. 4 is a diagram of exemplary functional components of modeling system 120 that relate to automatic solver selection. The functional components of modeling system 120 shown in FIG. 4 may be implemented, for example, as part of simulation tool 310 and/or any of the other components of modeling system 120 described above in connection with FIG. 3. Furthermore, the functional components of modeling system 120 shown in FIG. 4 may be implemented by processor 220 and memory 230 of computer device 110. Additionally or alternatively, some or all of the functional components of modeling system 120 shown in FIG. 4 may be implemented by hard-wired circuitry. As shown in FIG. 4, modeling system 120 may include a Jacobian generator 410, a stiffness calculator 420, a solver selector 430, one or more solvers 440-A to 440-N (referred to herein collectively as "solvers 440" and individually as "solver 440"), and a step size selector 450.

Jacobian generator 410 may generate a Jacobian matrix for a graphical model or for a subset of a graphical model. For example, Jacobian generator 410 may determine a block Jacobian matrix associated with blocks in the graphical model. Jacobian generator 410 may concatenate the block Jacobian matrices associated with blocks of the graphical model into a Jacobian matrix associated with the graphical model, or associated with a subset of the graphical model. Jacobian generator 410 may re-calculate the Jacobian matrix during a simulation of the graphical model.

Stiffness calculator 420 may calculate a stiffness associated with a graphical model based on a Jacobian matrix generated by Jacobian generator 410. For example, stiffness calculator 420 may determine the eigenvalues associated with the Jacobian matrix, may determine a maximum eigenvalue, may determine a minimum eigenvalue, and may determine the stiffness as a ratio of the maximum eigenvalue $t$ to the minimum eigenvalue. If a Jacobian matrix is re-calculated during a simulation, stiffness calculator 420 may re-calculate the stiffness based on the re-calculated Jacobian matrix. Furthermore, stiffness calculator 420 may calculate a stiffness for a particular state variable associated with the graphical model based on an eigenvalue associated with the particular state variable.

Solver selector 430 may automatically select a particular solver 440 for a simulation of a graphical model. Solver selector 430 may automatically select an explicit solver or an implicit solver for a simulation based on a stiffness determined by stiffness calculator 420. For example, if the stiffness is above a stiffness threshold, solver selector 430 may automatically select an implicit solver and if the stiffness is below the stiffness threshold, solver selector 430 may select an explicit solver. If a stiffness associated with the graphical model is re-computed during a simulation, solver selector 430 may change the solver based on the re-calculated stiffness. In some implementations, solver selector 430 may select different solvers for different state variables associated with a graphical model based a stiffness values associated with the different state variables.

Solver 440 may include a solver that may be used during a simulation. Solver 440 may include an explicit solver or an implicit solver. An explicit solver may use an explicit method to determine a response value at a next time step, as explained above. An implicit solver may use an implicit method to determine a response value at a next time step, as explained above. Solver 440 may include a fixed step solver or a variable step solver. A fixed step solver may not vary a size of a time step. A variable step solver may vary a step size based on whether an approximation is within a specified error tolerance, as explained above. Solver 440 may include a discrete solver or a continuous solver. A discrete solver may rely on discrete blocks to compute values for internal states at each time step. A continuous solver may use numerical integration to compute continuous states associated with continuous blocks. Solver 440 may include a one-step solver or a multi-step solver. A one-step solver may estimate a response value using the determined value at a previous time step. A multi-step solver may estimate a response value using the determined values at multiple preceding time steps. The solver categories described above may be associated with a particular solver. For example, solver 440 may correspond to an implicit, variable step, multi-step, continuous solver.

Step size selector 450 may select a step size for a variable step solver. For example, step size selector 450 may select a maximum step size for a variable step solver based on a maximum of a highest natural frequency associated with a graphical model and a highest forcing frequency associated with the graphical model. Step size selector 450 may also select a minimum step size for a variable step solver. The minimum step size may be based on, for example, a cutoff frequency associated with the graphical model.

Although FIG. 4 shows exemplary functional components of modeling system 120, in other implementations, modeling system 120 may include fewer functional components, different functional components, differently arranged functional components, or additional functional components than depicted in FIG. 4. Additionally or alternatively, one or more components of modeling system 120 may perform one or more tasks described as being performed by one or more other components of modeling system 120.

Figure 5:
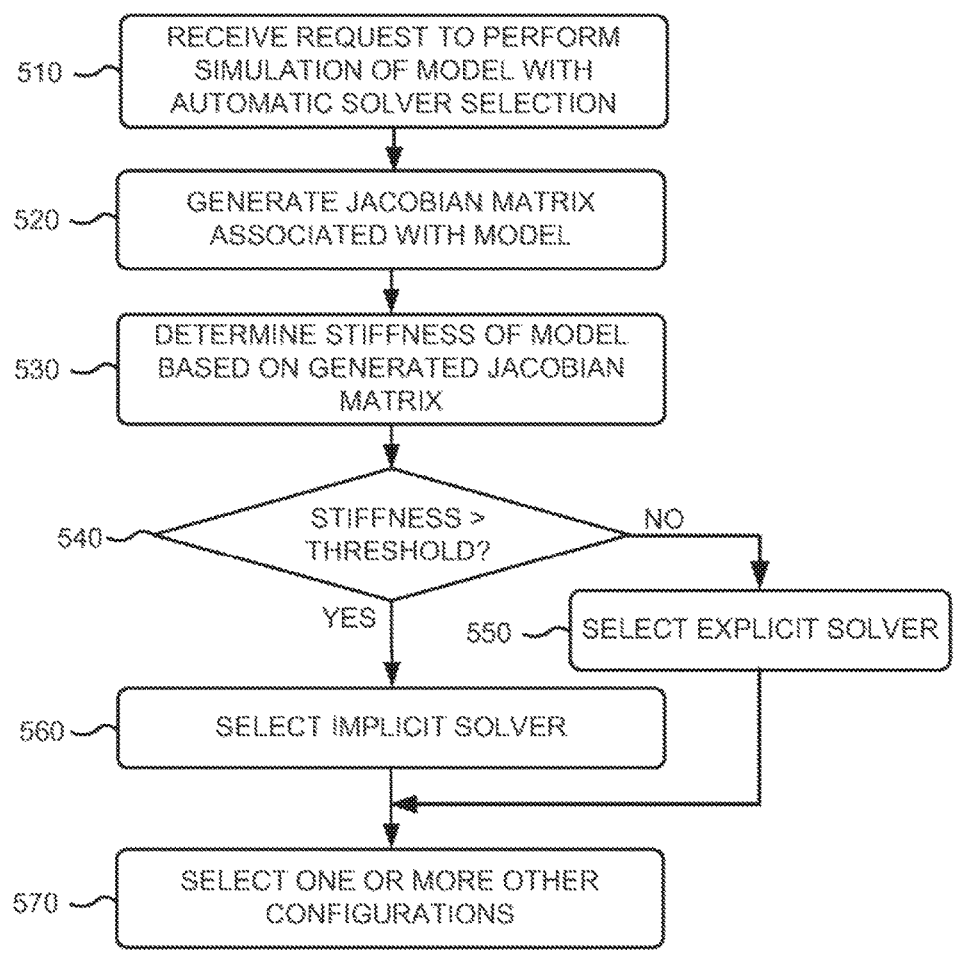
FIG. 5 is a flow diagram of an exemplary process for automatically selecting a solver according to an implementation described herein.

FIG. 5 is a flow diagram of an exemplary process for automatically selecting a solver according to an implementation described herein. In one implementation, the process of FIG. 5 may be performed by computer device 110. In other implementations, some or all of the process of FIG. 5 may be performed by another device or a group of devices separate from computer device 110 and/or including computer device 110.

The process of FIG. 5 may include receiving a request to perform a simulation of a model with automatic solver selection (block 510). For example, a user may open a simulation configuration menu and select an "automatic solver selection" option. The user may then activate a simulation of a graphical model.

A Jacobian matrix associated with the model may be generated (block 520). For example, Jacobian generator 410 may generate a Jacobian matrix for the graphical model based on block Jacobian matrices associated with the blocks of the graphical model. A stiffness of the model may be determined based on the generated Jacobian matrix (block 530). For example, stiffness calculator 420 may determine the eigenvalues associated with the generated Jacobian matrix. Stiffness calculator 420 may determine the maximum eigenvalue and the minimum eigenvalue of the determined eigenvalues and may calculate the stiffness as the ratio of the maximum eigenvalue to the minimum eigenvalue (e.g., using Equation (16)).

A determination may be made as to whether the stiffness exceeds a threshold (block 540). For example, solver selector 430 may determine whether the determined stiffness exceeds a stiffness threshold. The stiffness threshold may be determined heuristically. For example, a large number of systems, associated with a range of stiffness values, may be simulated using an explicit solver and a determination may be made as to whether the explicit solver remained stable. The stiffness values may be plotted against a measure of stability and a stiffness value may be determined at a point at which there is a large change, or a relatively large change, in the measure of stability. The stiffness value at the determined point may be set as the stiffness threshold.

If it is determined that the stiffness does not exceed the threshold (block 540—NO), an explicit solver may be selected (block 550). For example, solver selector 430 may select an explicit solver that uses an explicit method of estimating a response during a particular time step. Processing may continue to block 570. If it is determined that the stiffness exceeds the threshold (block 540—YES), an implicit solver may be selected (block 560). For example, solver selector 430 may select an implicit solver that uses an implicit method of estimating a response during a particular time step. The implicit solver may need to compute an inverse matrix based on a solver Jacobian matrix associated with the graphical model.

In some implementations, one or more other criteria may be used in selecting between an implicit solver and an explicit solver. For example, a computation cost associated with a Jacobian matrix may be determined. The computation cost may be determined based on factors such as a size of the Jacobian matrix, a sparsity (e.g., number of non-zero entries) of the Jacobian matrix, and/or another factor associated with the Jacobian matrix. If the computation cost is greater than a computation cost threshold and an implicit solver has been selected, the selection of the implicit solver may be changed to an explicit solver. The computation cost threshold may be determined heuristically based on, for example, a comparison of computation cost measurements versus measured simulation times. If an implicit solver selection is switched to an explicit solver selection based on determining that the computation cost exceeds a computation threshold, the user may be provided with an indication that the simulation may provide unstable results.

One or more other configurations may be selected (block 570). For example, a selection may be made between a fixed step solver and a variable step solver, between a single step solver and a multi-step solver, and/or between a discrete solver and a continuous solver. In some implementations, a variable step solver may be selected by default. In some implementations, a multi-step solver may be selected by default. A selection between a discrete solver and a continuous solver may be made based on whether the graphical model includes continuous blocks. For example, if continuous blocks are present, a continuous solver may be selected. If a variable step solver is selected, a maximum step size for the variable step solver may be determined automatically, as described below with reference to FIG. 6.

Figure 6:
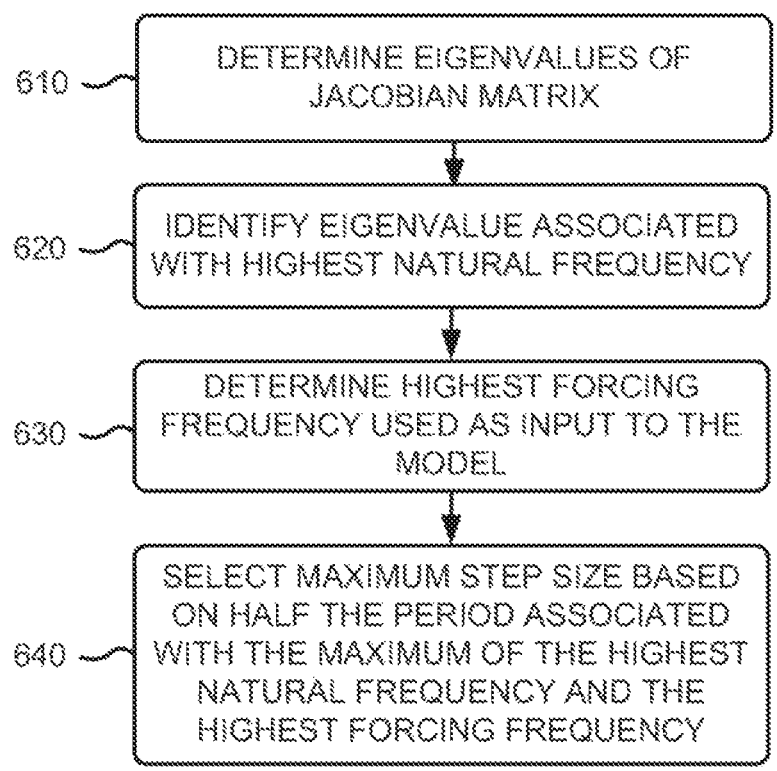
FIG. 6 is a flow diagram of an exemplary process for determining a maximum step size for a solver according to an implementation described herein.

FIG. 6 is a flow diagram of an exemplary process for determining a maximum step size for a variable step solver according to an implementation described herein. In one implementation, the process of FIG. 6 may be performed by computer device 110. In other implementations, some or all of the process of FIG. 6 may be performed by another device or a group of devices separate from computer device 110 and/or including computer device 110.

The process of FIG. 6 may include determining eigenvalues associated with a Jacobian matrix (block 610). For example, stiffness calculator 420 may determine the eigenvalues associated with the Jacobian matrix during computation of the stiffness value associated with a graphical model. An eigenvalue associated with the highest natural frequency may be identified (block 620). For example, step size selector 450 may obtain computed eigenvalues from stiffness calculator 420 and may select the eigenvalue associated with the highest natural frequency associated with the graphical model. An eigenvalue may represent the square of a natural frequency. Thus, the square roots of the eigenvalues may be determined and the highest value may be selected as the eigenvalue that corresponds to the highest natural frequency associated with the graphical model.

A highest forcing frequency used as an input to the model may be identified (block 630). For example, step size selector 450 may identify source blocks associated with the graphical model. A source block may generate a source signal that may be periodic in nature. A periodic source signal may provide forcing frequencies to the graphical model. Step size selector 450 may analyze each identified source block and may determine frequencies associated with each of the identified source blocks. Step size selector 450 may determine the highest forcing frequency associated with a source block.

A maximum step size may be selected based on half the period associated with the maximum of the highest natural frequency and the highest forcing frequency (block 640). For example, step size selector 450 may select the maximum of the highest natural frequency and the highest forcing frequency and may select the maximum step size as half (or another factor less than half) the period associated with the maximum of the highest natural frequency and the highest forcing frequency. In other implementations, the maximum step size may be determined using another technique.

In some implementations, a minimum step size may also automatically be determined for the variable step solver. The minimum step size may be determined based on a cutoff frequency associated with the graphical model. A cutoff frequency may correspond to the highest frequency to which a dynamic system responds and may correspond to the smallest time scale at which the system response may change. Therefore, time steps smaller than a period corresponding to the cutoff frequency may not provide further information about the response of the system and may, therefore, not be required.

Figure 7:
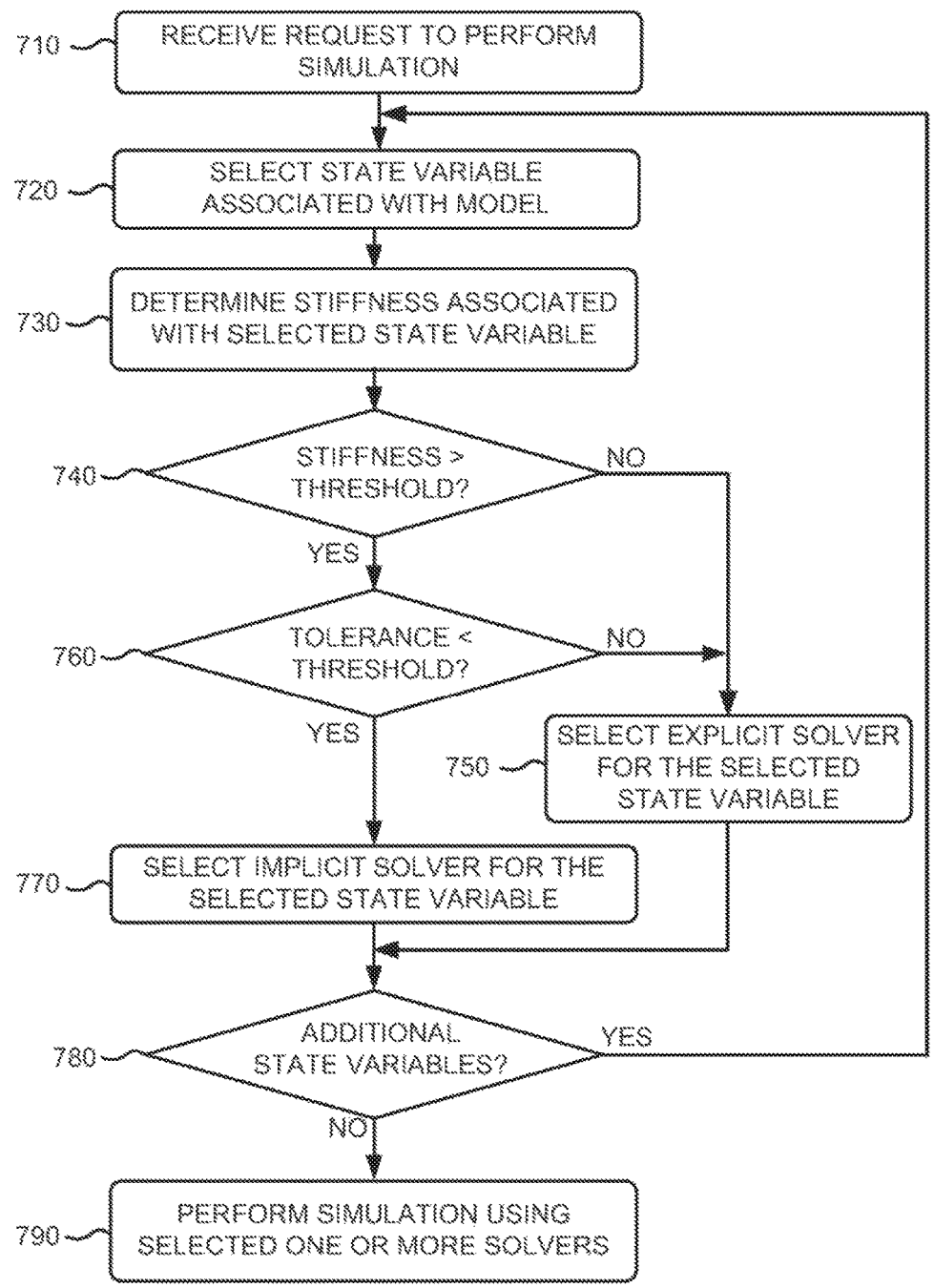
FIG. 7 is a flow diagram of an exemplary process for selecting solvers for different state variables according to an implementation described herein.

FIG. 7 is a flow diagram of an exemplary process for selecting solvers for different state variables according to an implementation described herein. In one implementation, the process of FIG. 7 may be performed by computer device 110. In other implementations, some or all of the process of FIG. 7 may be performed by another device or a group of devices separate from computer device 110 and/or including computer device 110.

The process of FIG. 7 may include receiving a request to perform a simulation (block 710). For example, a user may open a simulation configuration menu and select an "automatic solver selection" option. The user may then activate a simulation of a graphical model. A state variable associated with the model may be selected (block 720). For example, solver selector 430 may identify state variables associated with the graphical model. For example, individual blocks and/or sub-system blocks included in the graphical model may be analyzed to determine whether the blocks are associated with a state variable. For example, an integrator block may be associated with a state variable.

A stiffness associated with the selected state variable may be determined (block 730). As an example, if a sub-system block is associated with the selected state variable, a Jacobian matrix may be determined for the subsystem block (e.g., based on one or more components blocks associated with the subsystem block) and a stiffness associated with the subsystem block may be determined based on the determined Jacobian matrix.

As another example, stiffness calculator 420 may determine an eigenvalue associated with the selected state variable. The eigenvalues may correspond to roots of the characteristic equation associated with the solver Jacobian matrix and the characteristic equation may correspond to a multiplication of factors, wherein each factor may be associated with a state variable. Thus an eigenvalue may be identified for the state variable based on the characteristic equation. A stiffness for the selected state variable may be computed based on the determined eigenvalue. A stiffness associated with a particular eigenvalue may be determined, for example, by a difference of the particular eigenvalue from an average eigenvalue associated with the Jacobian matrix.

A determination may be made as to whether the determined stiffness is greater than a threshold (block 740). For example, solver selector 430 may determine whether the determined stiffness for the selected state variable exceeds a stiffness threshold. If it is determined that the stiffness is not greater than the threshold (block 740—NO), an explicit solver may be selected for the selected state variable (block 750). For example, solver selector 430 may select an explicit solver that uses an explicit method of estimating a response during a particular time step. Processing may continue to block 780.

If it is determined that the stiffness is greater than the threshold (block 740—YES), a determination may be made as to whether a tolerance is less than a tolerance threshold (block 760). For example, solver selector 430 may determine a tolerance associated with the selected state variable. A small tolerance for a state variable may indicate a requirement for a more precise solution and therefore an implicit solver may need to be selected for a state variable with an associated small tolerance.

If it is determined that the tolerance is not less than the tolerance threshold (block 760—NO), an explicit solver may be selected for the selected state variable (block 750). For example, solver selector 430 may select an explicit solver for the selected state variable. Processing may continue to block 780. If it is determined that the tolerance is less than the tolerance threshold (block 760—YES), an implicit solver may be selected for the selected state variable (block 770). For example, solver selector 430 may select an implicit solver for the selected state variable.

A determination may be made as to whether there are additional state variables (block 780). For example, solver selector 430 may determine whether additional state variables exist in the graphical model. If it is determined that there are additional state variables (block 780—YES), processing may return to block 720 to select another state variable. If it is determined that there are no additional state variables (block 780—NO), the simulation may be performed using the selected one or more solvers (block 790). For example, a simulation of the graphical model may be performed with different solvers being used for different state variables associated with the graphical model.

Figure 8:
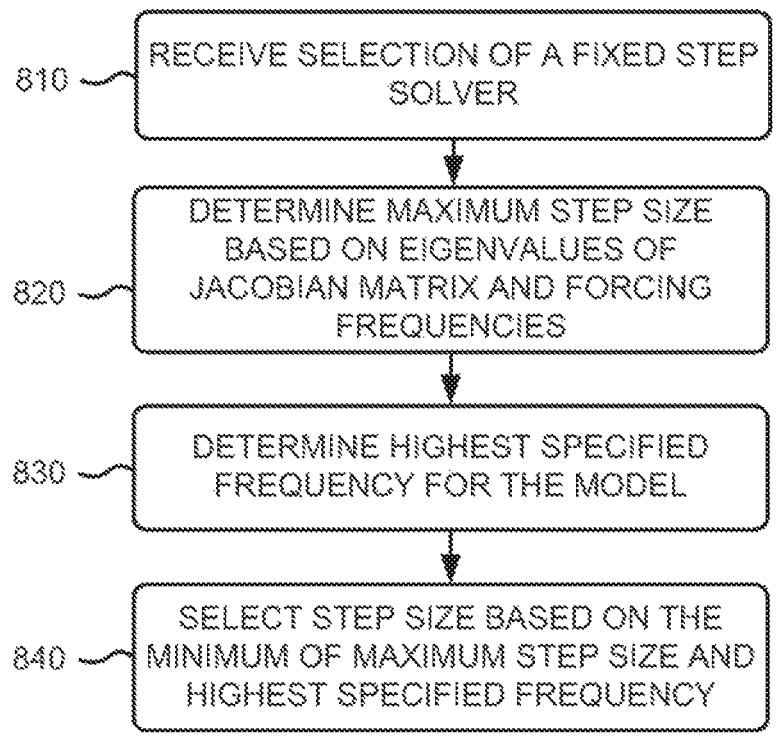
FIG. 8 is a flow diagram of an exemplary process for selecting a step size for a fixed step solver according to an implementation described herein.

FIG. 8 is a flow diagram of an exemplary process for selecting a step size for a fixed step solver according to an implementation described herein. In one implementation, the process of FIG. 8 may be performed by computer device 110. In other implementations, some or all of the process of FIG. 8 may be performed by another device or a group of devices separate from computer device 110 and/or including computer device 110.

The process of FIG. 8 may include receiving a selection of a fixed step solver (block 810). For example, in one implementation, a user may manually select a fixed step solver. In another implementation, a fixed step solver may be selected automatically. A fixed step solver may be selected automatically when, for example, a user specifies a tolerance that is higher than a particular threshold.

A maximum step size may be selected based on eigenvalues of the Jacobian matrix and based on the forcing frequencies (block 820). For example, a maximum step size may be selected by step size selector 450 as half (or a factor less than half) the period associated with the maximum of the highest natural frequency and the highest forcing frequency associated with the graphical model (as explained above with reference to FIG. 6).

A highest specified frequency for the model may be determined (block 830). As an example, a user may specify a highest frequency for the graphical model. As another example, the graphical model may be associated with a cutoff frequency (e.g., the graphical model may include a low pass filter). As yet another example, step size selector 450 may estimate a highest frequency associated with the graphical model based on a previous simulation.

A step size may be selected based on a minimum of the determined maximum step size and the determined highest specified frequency (block 840). For example, step size selector 450 may select the step size for the fixed step solver as the minimum of the determined maximum step size and the determined highest specified frequency.

Figure 9:
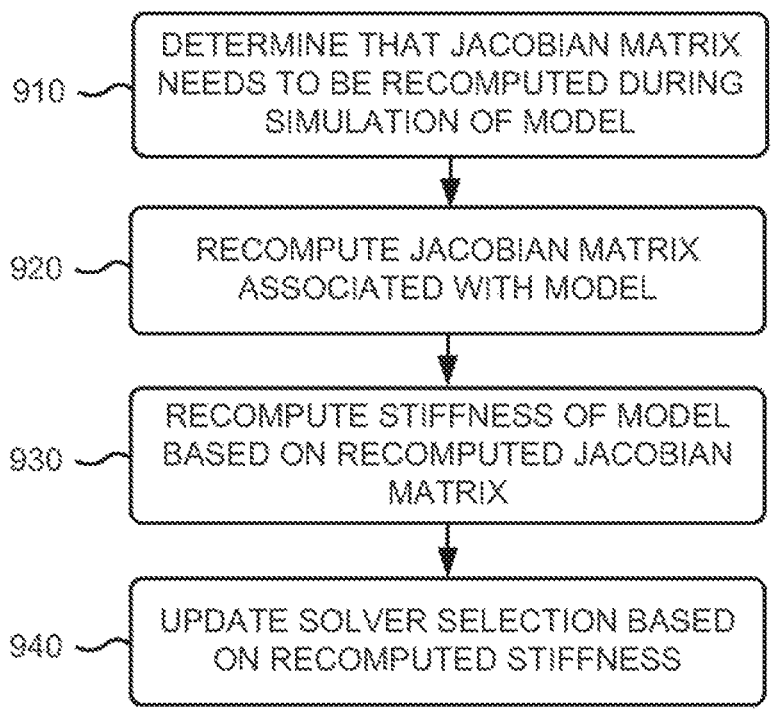
FIG. 9 is a flow diagram of an exemplary process for updating a solver during simulation according to an implementation described herein.

FIG. 9 is a flow diagram of an exemplary process for updating a solver during simulation according to an implementation described herein. The stiffness of a graphical model may differ at different time points. In one implementation, the process of FIG. 9 may be performed by computer device 110. In other implementations, some or all of the process of FIG. 9 may be performed by another device or a group of devices separate from computer device 110 and/or including computer device 110.

The process of FIG. 9 may include determining that a Jacobian matrix needs to be recomputed during a simulation of a model (block 910). For example, Jacobian generator 410 may determine that the Jacobian matrix needs to be recomputed. The Jacobian matrix may need to be recomputed when, for example, a new block becomes activated during the simulation, when a zero crossing event has occurred during the simulation, when a multi-step solver has reset during a simulation, when an error tolerance has been exceeded by a variable step solver during simulation, when a failure associated with an integration step has been detected, when a user-defined event has been detected, and/or when another type of event occurs that may trigger a re-computation of the Jacobian matrix.

The Jacobian matrix associated with the model may be recomputed (block 920) and the stiffness of the model may be recomputed based on the recomputed Jacobian matrix (block 930). For example, Jacobian generator 410 may recompute the Jacobian matrix associated with the graphical model and stiffness calculator 420 may recompute the stiffness associated with the graphical model based on the recomputed Jacobian matrix.

The solver selection may be updated based on the recomputed stiffness (block 940). As an example, solver selector 430 may change a solver being used during the simulation from an explicit solver to an implicit solver if the stiffness associated with the graphical has increased to a value that exceeds the stiffness threshold. As another example, solver selector 430 may change an implicit solver to an explicit solver if the stiffness associated with the graphical model has decreased to a value that is less than the stiffness threshold. As yet another example, the maximum step size of a variable step model may be re-computed.

Jacobian matrices computed during a simulation may be stored, along with information relating to the simulation time step at which a particular Jacobian matrix was generated. When a trigger occurs to generate a new Jacobian matrix, the previous Jacobian matrix may be stored, along with information about when the Jacobian matrix was used, such as the time interval during which the previous Jacobian matrix was used. The stored Jacobian matrices may be used during a subsequent simulation and may be used to select different solvers for different time intervals during the subsequent simulation.

Figure 10:
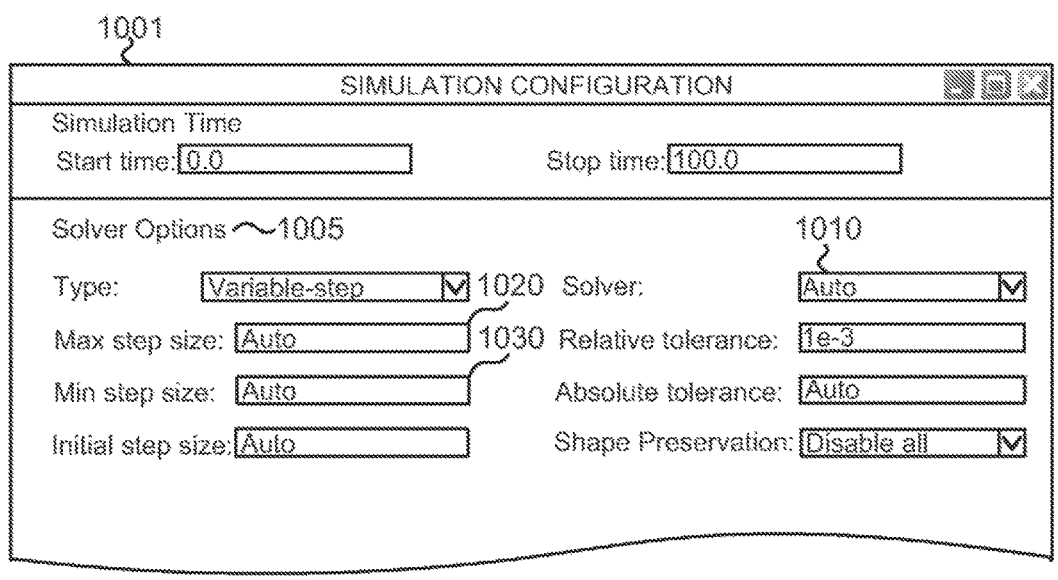
FIG. 10 is an exemplary user interface for enabling a user to select an automatic solver selection option according to an implementation described herein.

FIG. 10 is an exemplary user interface 1001 for enabling a user to select an automatic solver selection option according to an implementation described herein. User interface 1001 may be presented to a user when the user selects a simulation configuration option from a menu or another type of selection object. User interface 1001 may enable a user to specify one or more simulation configuration settings. The simulation configuration settings may include a solver options area 1005.

Solver options area 1005 may include, among other things, a solver selection object 1010, a maximum step size selection object 1020, and a minimum step size selection object 1030. Solver selection object 1010 may enable a user to select a particular type of solver for a simulation. Solver selection object 1010 may include an option to automatically select the solver and the user may select to automatically select a solver for a simulation of a graphical model, as described above with reference to FIG. 5. Maximum step size selection object 1020 may enable a user to specify a maximum step size for a variable step solver, as described above with reference to FIG. 6. Maximum step size selection object 1020 may include an option to automatically select the maximum step size and the user may select to automatically select the maximum step size for a variable step solver. Minimum step size selection object 1030 may enable a user to specify a minimum step size for a variable step solver. Minimum step size selection object 1030 may include an option to automatically select the minimum size and the user may select to automatically select the minimum step size for a variable step solver. Solver options area 1005 may include other options, such as options to define tolerance settings associated with a simulation of a graphical model.

Although FIG. 10 shows exemplary components of user interface 1001, in other implementations, user interface 1001 may include fewer components, different components, differently arranged components, or additional components than depicted in FIG. 10.

Figure 11:
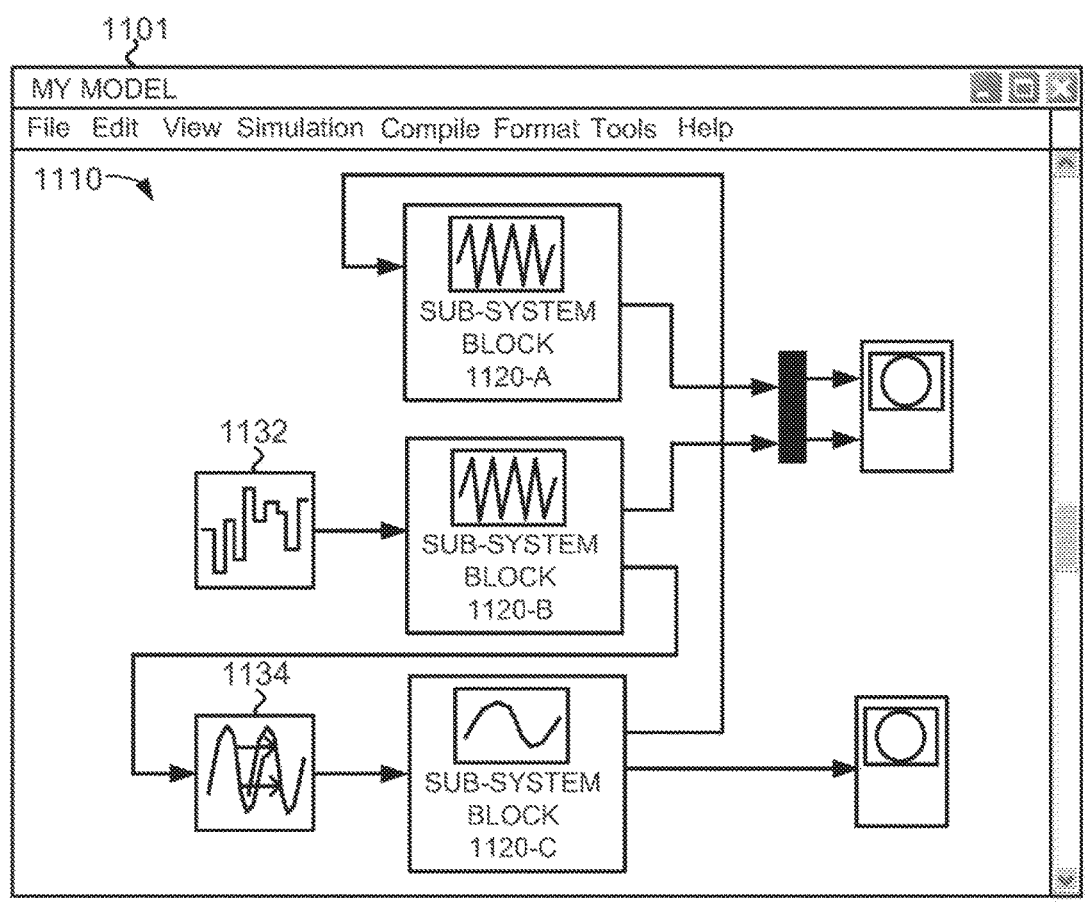
FIG. 11 is an example of an automatic solver selection according to an implementation described herein.

FIG. 11 is an example of a user interface 1101 that illustrates an automatic solver selection according to an implementation described herein. User interface 1101 may include a graphical model 1110. Graphical model 1110 may include a subsystem block 120-A, a subsystem block 1120-B, and a subsystem block 1120-C. Subsystem blocks 1120-A, 1120-B, and 1120-C may each correspond to hierarchical blocks that include multiple blocks that are interconnected in particular ways and that comprise a subsystem represented by a single block in graphical model 1110. During a simulation of graphical model 1110, solver selector 430 may select a different solver for each of sub-system blocks 1120-A, 1120-1B, and 1120-C.

Subsystem block 1120-A may be associated with a first state variable. The first state variable may be associated with a stiffness that is greater than a stiffness threshold and may be associated with a low tolerance. Therefore, an implicit solver may be selected for the first state variable associated with sub-system 1120-A.

Subsystem block 1120-B may be associated with a second state variable. The second state variable may be associated with a stiffness that is higher than the stiffness threshold and may be associated with a high tolerance. Therefore, an explicit solver may be selected for the second state variable associated with subsystem 1120-B.

Subsystem block 1120-C may be associated with a third state variable. The third state variable may be associated with a stiffness that is less than the stiffness threshold. Therefore, an explicit solver may be selected for the third variable associated with subsystem 1120-C (as explained above with reference to FIG. 7).

Subsystem 1120-B may be associated with source block 1132. Source block 1132 may provide an input to graphical model 1110 and may represent, for example, an incoming transmission signal, a sensor, mechanical forces experienced by the system, etc. Source block 1132 may be associated with a forcing frequency that is higher than the highest natural frequency associated with subsystem 1120-B. Therefore, a maximum step size for a variable step solver for subsystem 1120-B may be selected based on the forcing frequency associated with source block 1132 (as explained above with reference to FIG. 6).

Subsystem 1120-B may include a connection that feeds back to subsystem 1120-C through delay block 1134. After delay block 1134 activates, subsystem 1120-C may begin to exhibit stiff behavior. The stiffness associated with subsystem 1120-C may be re-calculated after delay block 1134 activates (as explained above with reference to FIG. 9). The re-calculated stiffness may be greater than the stiffness threshold. Therefore, the explicit solver may be switched to an implicit solver after delay block 1134 is activated.

The foregoing description provides illustration and description, but is not intended to be exhaustive or to limit the implementations to the precise form disclosed. Modifications and variations are possible in light of the above teachings or may be acquired from practice of the described implementations.

For example, while series of blocks have been described with respect to FIGS. 5-9, the order of the blocks may be modified in other implementations. Further, non-dependent blocks may be performed in parallel.

Also, certain portions of the implementations may have been described as a "component," "logic," "tool," "engine," "selector," "generator," "calculator," and/or "system" that performs one or more functions. The described "component," "logic," "tool," "engine," "selector," "generator," "calculator," and/or "system" may include hardware, such as a processor, an ASIC, or a FPGA, or a combination of hardware and software (e.g., software running on a processor).

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the implementation. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

This application is related to U.S. patent application Ser. No. 13/652,180, filed Oct. 15, 2012, which is incorporated, in its entirety, herein by reference.

What is claimed is:

1. A method, performed by a computer device, the method comprising:

receiving a request to select a selected solver for a simulation of an executable graphical model,
the receiving the request being performed by the computer device;

determining one or more inputs of the executable graphical model,
the determining the one or more inputs being performed by the computer device;

determining one or more equations of the executable graphical model,
the one or more equations including the one or more inputs of the executable graphical model,
the determining the one or more equations being performed by the computer device;

determining, based on the one or more equations, a sensitivity of behaviors of the executable graphical model,
the determining the sensitivity being performed by the computer device;
calculating a stiffness of the executable graphical model based on the sensitivity,
the calculating the stiffness being performed by the computer device;
determining whether the stiffness is greater than a stiffness threshold,
the determining whether the calculated stiffness is greater than the stiffness threshold being performed by the computer device;
selectively and automatically selecting:
an implicit solver as the selected solver for the simulation of the executable graphical model, when the stiffness is greater than the stiffness threshold,
the implicit solver executing the executable graphical model, having the stiffness greater than the stiffness threshold, more efficiently than an explicit solver, and
the selecting the implicit solver being performed by the computer device; or
the explicit solver as the selected solver for the simulation, when the stiffness is not greater than the stiffness threshold,
the explicit solver executing the executable graphical model, having the stiffness not greater than the stiffness threshold, more efficiently than the implicit solver, and
the selecting the explicit solver being performed by the computer device; and
performing the simulation using the selected solver to provide a desired simulation efficiency,
the performing the simulation being performed by the computer device.

2. The method of claim 1, where the calculating the stiffness of the executable graphical model includes:
calculating the stiffness based on a ratio of a maximum real part of an eigenvalue of a Jacobian matrix to a minimum real part of the eigenvalue of the Jacobian matrix.

3. The method of claim 1, further comprising:
determining a step size for the implicit solver or the explicit solver based on eigenvalues of a Jacobian matrix,
where the simulation is performed based on the step size.

4. The method of claim 3, where the determining the step size for the implicit solver or the explicit solver based on the eigenvalues of the Jacobian matrix includes:
determining the eigenvalues of the Jacobian matrix;
identifying an eigenvalue, of the determined eigenvalues, associated with a highest natural frequency;
determining a highest forcing frequency used as input to the executable graphical model; and
selecting the step size based on a period associated with a maximum of the highest natural frequency and the highest forcing frequency.

5. The method of claim 1, further comprising:
providing a user interface to select a simulation configuration,
where the user interface includes an option to automatically select the selected solver for the simulation; and
receiving a selection of the option to automatically select the selected solver for the simulation.

6. The method of claim 1, where the determining the sensitivity includes:
determining a Jacobian matrix associated with the executable graphical model based on the one or more equations; and
the method further comprising:
determining a computation cost associated with the Jacobian matrix, based on the selectively and automatically selecting the implicit solver for the simulation;
determining that the computation cost associated with the Jacobian matrix is greater than a computation cost threshold; and
changing the selected solver to select the explicit solver based on the determining that the computation cost associated with the Jacobian matrix is greater than the computation cost threshold.

7. The method of claim 1, further comprising:
selecting a first type of solver for a first set of one or more states associated with the executable graphical model; and
selecting a second type of solver for a second set of the one or more states associated with the executable graphical model,
where the first type of solver is different from the second type of solver.

8. The method of claim 1, where the calculating the stiffness of the executable graphical model includes:
selecting one or more states associated with the executable graphical model; and
calculating a stiffness associated with the selected one or more states; and
where the method further comprises:
automatically selecting the implicit solver for the selected one or more states, based on determining that the stiffness associated with the selected one or more states, associated with an eigenvalue, is greater than the stiffness threshold; and
automatically selecting the explicit solver for the selected one or more states, based on determining that the stiffness associated with the one or more states, associated with the eigenvalue, is not greater than the stiffness threshold.

9. The method of claim 8, further comprising:
determining a tolerance associated with the selected one or more states;
determining whether the tolerance exceeds a tolerance threshold; and
automatically selecting the explicit solver for the selected one or more states, based on determining that the tolerance exceeds the tolerance threshold.

10. The method of claim 1, where the determining the sensitivity includes:
determining a Jacobian matrix associated with the executable graphical model based on the one or more equations;
where the calculating the stiffness includes:
calculating the stiffness based on the Jacobian matrix; and
where the method further comprises:
determining a re-computed Jacobian matrix during the simulation of the executable graphical model;
re-computing the stiffness of the executable graphical model based on the re-computed Jacobian matrix; and changing the selected solver to a different solver during the simulation based on the re-computing the stiffness.

11. The method of claim 10, further comprising:
storing the Jacobian matrix in memory prior to the determining the re-computed Jacobian matrix.

12. The method of claim 1, further comprising:
receiving a selection of a fixed step solver for the simulation of the executable graphical model;
determining a determined step size based on at least one of eigenvalues of a Jacobian matrix or forcing frequencies used as input into the executable graphical model;
determining a highest specified frequency for the executable graphical model; and
selecting a step size for the fixed step solver based on a minimum of the determined step size and the highest specified frequency.

13. A non-transitory computer-readable medium storing instructions, the instructions comprising:
one or more instructions which, when executed by one or more processors of a computer device, cause the one or more processors to:
store an executable graphical model of a dynamic system;
receive a request to select a selected solver for a simulation of the executable graphical model;
determine one or more inputs of the executable graphical model;
determine one or more equations of the executable graphical model;
determine, based on the one or more equations, a sensitivity of behaviors of the executable graphical model;
calculate a stiffness of the executable graphical model based on the sensitivity;
determine whether the stiffness is greater than a stiffness threshold;
automatically select an implicit solver as the selected solver for the simulation of the executable graphical model when the stiffness is greater than the stiffness threshold,
the implicit solver executing the executable graphical model, having the stiffness greater than the stiffness threshold, more efficiently than an explicit solver;
automatically select the explicit solver as the selected solver for the simulation of the executable graphical model when the stiffness is not greater than the stiffness threshold,
the explicit solver executing the executable graphical model, having the stiffness not greater than the stiffness threshold, more efficiently than the implicit solver; and
perform the simulation using the selected solver to maintain a desired simulation efficiency.

14. The non-transitory computer-readable medium of claim 13, further comprising:
one or more instructions to calculate the stiffness based on a ratio of a maximum eigenvalue of a Jacobian matrix to a minimum eigenvalue of the Jacobian matrix.

15. The non-transitory computer-readable medium of claim 13, further comprising:
one or more instructions to determine a step size for the implicit solver or the explicit solver based on eigenvalues of a Jacobian matrix,
where the simulation is performed based on the step size.

16. The non-transitory computer-readable medium of claim 15, where the one or more instructions to determine the step size for the implicit solver or the explicit solver based on the eigenvalues of the Jacobian matrix include:
one or more instructions to determine the eigenvalues of the Jacobian matrix;
one or more instructions to identify an eigenvalue, of the determined eigenvalues, associated with a highest natural frequency;
one or more instructions to determine a highest forcing frequency used as input to the executable graphical model; and
one or more instructions to select a maximum step size for the implicit solver or the explicit solver based on a period associated with a maximum of the highest natural frequency and the highest forcing frequency.

17. The non-transitory computer-readable medium of claim 13, further comprising:
one or more instructions to provide a graphical user interface to select a simulation configuration,
where the graphical user interface includes an option to automatically select the selected solver for the simulation; and
one or more instructions to receive a selection of the option.

18. The non-transitory computer-readable medium of claim 13, further comprising:
one or more instructions to determine a computation cost associated with a Jacobian matrix, based on automatically selecting the implicit solver for the simulation;
one or more instructions to determine that the computation cost associated with the Jacobian matrix is greater than a computation cost threshold; and
one or more instructions to change the selected solver to the explicit solver, based on determining that the computation cost associated with the Jacobian matrix is greater than the computation cost threshold.

19. The non-transitory computer-readable medium of claim 13, further comprising:
one or more instructions to select a first type of solver for a first set of one or more states associated with the executable graphical model; and
one or more instructions to select a second type of solver for a second set of the one or more states associated with the executable graphical model,
where the first type of solver is different from the second type of solver.

20. The non-transitory computer-readable medium of claim 13, further comprising:
one or more instructions to select one or more states associated with the executable graphical model;
one or more instructions to calculate a stiffness associated with the selected one or more states; and
one or more instructions to:
automatically select the implicit solver for the selected one or more states, based on determining that the stiffness associated with the selected one or more states, associated with an eigenvalue, is greater than the stiffness threshold; and
automatically select the explicit solver for the selected one or more states, based on determining that the stiffness associated with the selected one or more states, associated with the eigenvalue, is not greater than the stiffness threshold.

21. The non-transitory computer-readable medium of claim 20, further comprising:
one or more instructions to determine a tolerance associated with the selected one or more states;
one or more instructions to determine whether the tolerance is greater than a tolerance threshold; and
one or more instructions to automatically select the explicit solver for the selected one or more states, when the tolerance is greater than the tolerance threshold.

22. The non-transitory computer-readable medium of claim 13, further comprising:
one or more instruction to determine a Jacobian matrix associated with the executable graphical model based on the one or more equations,
where the stiffness is calculated based on the Jacobian matrix;
one or more instructions to determine a re-computed Jacobian matrix during the simulation of the executable graphical model;
one or more instructions to re-compute the stiffness of the executable graphical model based on the re-computed Jacobian matrix; and
one or more instructions to change the implicit solver or the explicit solver to a different solver during the simulation based on the re-computing the stiffness.

23. The non-transitory computer-readable medium of claim 22, where the one or more instructions to determine the re-computed Jacobian matrix during the simulation of the executable graphical model include:
one or more instructions to store the Jacobian matrix in memory prior to determining the re-computed Jacobian matrix.

24. The non-transitory computer-readable medium of claim 13, further comprising:
one or more instructions to receive a selection of a fixed step solver for the simulation of the executable graphical model;
one or more instructions to determine a maximum step size based on at least one of eigenvalues of a Jacobian matrix or forcing frequencies used as input into the executable graphical model;
one or more instructions to determine a highest specified frequency for the executable graphical model; and
one or more instructions to select a step size for the fixed step solver based on a minimum of the determined maximum step size and the determined highest specified frequency.

25. A computing device, comprising:
a memory storing executable instructions for implementing an executable graphical model of a dynamic system; and
a processor to:
receive a request to select a selected solver for a simulation of the executable graphical model;
determine one or more inputs of the executable graphical model;
determine one or more equations of the executable graphical model;
determine, based on the one or more equations, a sensitivity of behaviors of the executable graphical model;
calculate a stiffness of the executable graphical model based on the sensitivity;
determine whether the stiffness is greater than a stiffness threshold;
either:
automatically select an implicit solver as the selected solver for the simulation of the executable graphical model, based on determining that the calculated stiffness is greater than the stiffness threshold,
the implicit solver executing the executable graphical model, having the stiffness greater than the stiffness threshold, more efficiently than an explicit solver; or
automatically select the explicit solver as the selected solver for the simulation of the executable graphical model, based on determining that the calculated stiffness is not greater than the stiffness threshold,
the explicit solver executing the executable graphical model, having the stiffness not greater than the stiffness threshold, more efficiently than the implicit solver; and
perform the simulation using the selected solver to maintain a desired simulation efficiency.

26. The method of claim 1, where the determining the sensitivity includes:
determining a Jacobian matrix associated with the executable graphical model based on the one or more equations; and
where the calculating the stiffness includes:
calculating the stiffness based on the Jacobian matrix.

27. The method of claim 1, where the implicit solver is selected, and
where the implicit solver executes the executable graphical model, having the stiffness greater than the stiffness threshold, more accurately than the explicit solver.

28. The method of claim 1, where the explicit solver is selected, and
where the explicit solver executes the executable graphical model, having the stiffness not greater than the stiffness threshold, faster than the implicit solver.

* * * * *

UNITED STATES PATENT AND TRADEMARK OFFICE
CERTIFICATE OF CORRECTION

PATENT NO. : 10,423,732 B2
APPLICATION NO. : 15/072239
DATED : September 24, 2019
INVENTOR(S) : Zhang et al.

It is certified that error appears in the above-identified patent and that said Letters Patent is hereby corrected as shown below:

In the Specification

Column 11, Lines 58-59 reads:
"their combination may represent power. For example, connector connector lines may represent voltage, and current,"
Should read:
--their combination may represent power. For example, connector lines may represent voltage, and current,--

Column 23, Line 19 reads:
"include a subsystem block 120-A, a subsystem block 1120-"
Should read:
--include a subsystem block 1120-A, a subsystem block 1120- --

Column 23, Line 27 reads:
"1120-A, 1120-1B, and 1120-C."
Should read:
--1120-A, 1120-B, and 1120-C.--

Signed and Sealed this
Twenty-sixth Day of May, 2020

Andrei Iancu
*Director of the United States Patent and Trademark Office*